United States Patent [19]

Suzuki

[11] Patent Number: 5,554,304
[45] Date of Patent: Sep. 10, 1996

[54] PROCESS FOR PRODUCING A MICROMOTION MECHANICAL STRUCTURE

[75] Inventor: Kenichiro Suzuki, Tokyo, Japan

[73] Assignee: Nec Corporation, Tokyo, Japan

[21] Appl. No.: 409,990

[22] Filed: Mar. 24, 1995

Related U.S. Application Data

[62] Division of Ser. No. 52,272, Apr. 20, 1993, Pat. No. 5,428,259, which is a continuation of Ser. No. 650,017, Feb. 4, 1991, abandoned.

[30] Foreign Application Priority Data

Feb. 2, 1990 [JP] Japan ......................................... 2-23684
Feb. 2, 1990 [JP] Japan ......................................... 2-23685

[51] Int. Cl.⁶ ........................... H01L 21/306; B44C 1/22
[52] U.S. Cl. .................. 216/2; 156/628.1; 156/633.1; 156/631.1; 216/33; 216/36; 216/41
[58] Field of Search ......................................... 216/002, 033, 216/036, 041; 310/309; 437/927; 156/628.1, 633.1, 647.1, 657.1, 659.11, 631.1, 662.1

[56] References Cited

U.S. PATENT DOCUMENTS

| | | |
|---|---|---|
| 4,381,672 | 5/1983 | O'Conner .............................. 310/309 |
| 4,754,185 | 6/1988 | Gabriel et al. ......................... 310/309 |
| 4,943,750 | 7/1990 | Howe et al. ........................... 310/309 |
| 5,013,954 | 5/1991 | Shibaike et al. ...................... 310/309 |
| 5,015,906 | 5/1991 | Cho et al. ............................. 310/309 |
| 5,043,043 | 8/1991 | Howe ..................................... 310/309 |
| 5,045,152 | 9/1991 | Sickafus ......................... 156/647.1 X |
| 5,055,731 | 10/1991 | Nihel et al. ........................... 310/309 |
| 5,059,556 | 10/1991 | Wilcoxen ........................... 437/927 X |

*Primary Examiner*—William Powell
*Attorney, Agent, or Firm*—Burns, Doane, Swecker & Mathis, L.L.P.

[57] ABSTRACT

In a micromotion mechanical structure, such as a vibration-type sensor or a step motor, comprising at least one fixed electrode and at least one movable electrode which is moved by electrostatic power applied to the fixed electrode, at least one of the electrodes is formed essentially by a single crystal semiconductor material. The single crystal semiconductor material has various merits of uniform mechanical properties, small internal stress, etc. for use in such electrodes. Such structure has been realized by attaching patterned electrode made of the material to another substrate and then removing or thinning the original substrate carrying the patterned electrodes.

7 Claims, 14 Drawing Sheets

PROCESS FOR PRODUCING A MICROMOTION MECHANICAL STRUCTURE

This application is a divisional of application No. 08/052,272, filed Apr. 20, 1993, now U.S. Pat. No. 5,428,259, which is a continuation of application Ser. No. 07/650,017, filed on Feb. 4, 1991, now abandoned.

BACKGROUND OF THE INVENTION

1. Field of the Invention

The present invention relates to a micromotion mechanical structure which is used for example in a minute and high precision vibration-type sensor, an actuator for a high-performance robot, a recording or reading head for a magnetic or laser disc, a micro-optical system for optical scanning, modulation, etc., a micro-manipulator for use in a medical field, etc. and a gas precision control system.

2. Description of the Prior Art

Up to the present, micromotion mechanical structures used in the above technical fields have been produced mainly by a mechanical working technique such as lathe working, and owing to recent progress in the mechanical working technique, it is possible to produce a high precision product at a relatively low cost. However, owing to rapid progress in the field of microelectronics in these days, electronic parts have drastically been made smaller in size, and so further reduction of size has strongly been required for an entire system. It is however impossible to reduce a size of a mechanical element by any technique in extension of conventional mechanical working, as the recent rapid progress in electronics has made electronic parts smaller. It is therefore strongly expected to develop an innovative working technique which enables drastic reduction in size of a mechanical element.

For example, in the field of a magnetic or laser disc head, a detector portion of a head for reading a recording medium of high density is extremely minutely worked. Such detector portion is mounted on a metal arm to an extent of some centimeters for moving on the recording medium and is driven with the precision to an extent of 15–30 μm by means of a servomechanism. Its drive pitch is limited by a natural frequency of its structure. As the size of a movable structure becomes smaller, its natural frequency becomes higher, and as a result, it becomes possible to drive the structure at a higher speed and therefore to operate the structure more minutely by combining it with a servomechanism. In the presently employed structure wherein the detector portion is mounted on a metal arm, however, it is very difficult to reduce the size of the entire structure, since even if its elemental parts were further minutely produced, it is very difficult to mount such very minute parts on the structure. On the other hand, the progress in the recording medium has enabled recording signals with a pitch to an extent of not larger than μm Accordingly, it is understood that the largest problem for realizing high density signal recording is the large size of a head driving mechanism.

There is no report made on a technique which realize a minute structure of the head by any means different from extensions of the conventional technique.

Just recently, however, an innovative technique has been reported in connection with a silicon vibration type sensor. The present inventor has studied this report and found that this may be applicable to production of the minute head but there are still some difficulties to be overcome, as mentioned hereinafter.

The report was made by W. C. Tang, et al. in the Proceedings of IEEE Micro Electro Mechanical Systems (February 1989) at pages 53–59 entitled "Laterally Driven Polysilicon Resonant Microstructures". Attached FIG. 9 is recited therefrom and shows a plan view of a vibration-type sensor.

The structure shown in FIG. 9 is made of polysilicon deposited on a surface of a silicon substrate. In FIG. 9, fixing plates 13 to which fixed electrodes 11a and 11b are connected and supporting plates 14 to which folded beams 15 are connected are formed in contact with a silicon substrate 1. The fixed electrodes 11a and 11b and movable electrodes 12 which are connected to the folded beams 15 respectively are supported by the fixing plates 13 and the supporting plates 14 so that they are suspended on the silicon substrate 1. The fixed electrodes 11a and 11b and the movable electrodes 12 respectively are in the form of comb teeth and are interdigitated to each other to an extent of ⅓ of the teeth length. This vibration-type sensor has three pads for voltage supply, that is, pads 17 and 18 for supplying voltages to the fixed electrodes 11a and 11b respectively of reverse phases alternating between a supply voltage and the ground, and a pad 16 for a voltage always of the ground to the movable electrodes 12 through the supporting plates 14 and the folded beams 15. This means that when the pad 17 has a supply voltage, the pad 18 has a ground voltage and so the movable electrodes 12 are attracted toward the fixed electrode 11a by an electrostatic force and move in an up direction in the drawing. Subsequently when the voltage of the pad 17 is changed to the ground voltage, the voltage of the pad 18 is changed to a supply voltage and so the movable electrodes 12 are attracted toward the fixed electrode 11b and move in a down direction in the drawing. When the voltages of the pads 17 and 18 are changed in a cycle near to the natural frequency of the movable electrodes, the movable electrodes 12 vibrate in a large amplitude. Since the natural frequency of the movable electrode is a function of an atmospheric pressure, etc. on condition that the structure of the movable electrode is specified, it is possible to detect the pressure of air, etc., by detecting the natural frequency and so to use the structure as a sensor. By the way, the shapes of the folded beams 15 are changed by the movement of the movable electrodes 12 and owing to this stress the folded beams 15 tend to return the movable electrodes 12 to their original positions. Therefore, a moving distance of the movable electrodes 12 is a function of not only the applied voltage but also of the stiffness of the folded beams 15.

Such a vibration-type sensor made of polysilicon as above can be produced in a very minute scale. A process for the production thereof will be explained hereinafter with reference to the attached FIG. 10.

On one main surface of a silicon substrate 20, an oxide film 21 and a nitride film 22 are deposited and then a separation window 23 is patterned for separating a fixed electrode and a movable electrode [FIG. 10 (a)]. By depositing polysilicon and carrying out a patterning, a polysilicon electrode 25 connected to the pad 16 (shown in FIG. 9) and a polysilicon electrode 24 connected to the pad 17 or 18 (shown in FIG. 9) are formed [FIG. 10 (b)]. Then, a phosphosilicate glass (PSG) film 26 is deposited and patterned [FIG. 10 (c)], and a second polysilicon film 27 and a second PSG film 28 are deposited [FIG. 10 (d)]. The second PSG film 28 is patterned and by using it as a mask, the polysilicon film 27 is patterned and then the second PSG film 28 is removed [FIG. 10 (e)]. By immersing the obtained device in a hydrofluoric acid solution for a long time, the first PSG film 26 is removed to form the fixed electrodes 11a and 11b and the movable electrodes 12 (shown in FIG. 9) in the form suspended on the silicon substrate 20 by the second polysilicon film 27 [FIG. 10 (f)]. The thickness of the electrodes 11a, 11b and 12 is to an extent of 2 μm. The numeral 13 in FIG. 10 (f) indicates the fixing plates 13 in FIG. 9.

On the other hand, in the field of optical modulation, an optical chopper has heretofore been prepared from a metal gear and an electromagnetic motor for driving the gear. Because high precision working is required, it is difficult to reduce a diameter of the gear less than some mm. Further, because the motor for driving the gear makes use of a coil, it is impossible to reduce a size of the motor to a minute level. Accordingly, a size of the optical chopper cannot be made smaller than some cm³. On the other hand, as is well known, it is possible in an optical or electronic integrated circuit to integrate almost all necessary functions on a small chip of some mm square. It is therefore understood that in this field large sizes of mechanical elements and a driving system therefor are the largest problems for realizing a minute entire system.

Recently, it was proposed to produce a joint for connecting movable mechanical parts on a surface of a silicon substrate by making use of a surface micromachining technique of polysilicon and in effect trial production was made for a gear, a spring, a slider and a micro-cutter. Particularly, L. S. Fan et al. made a report on "IC-Processed Electrostatic Micro-motors" in Technical Digest of International Electron Devices Meeting '88 (IEDM '88) at pages 666–669, wherein trial production of a polysilicon micromotor having a diameter to an extent of 100 μm and a thickness to an extent of 1 μm and its actual performance of revolution by electrostatic force to an extent of 500 rpm are described. This technique will be explained hereinafter with reference to attached FIGS. 25 and 26.

FIG. 25 (a) and FIG. 25 (b) respectively show plan view and a cross section along a line 25b–25b indicated in FIG. 25 (a) of a polysilicon step motor produced by L. S. Fan et al. and described in the above literature IEDM '88. This micromotor is constituted by three elements, that is, a rotor 201, a shaft 202 having a cap 204 to cover a center portion of the rotor 201 and prevent it from coming off and stators 203 located around the rotor 201 for applying an electrostatic force to the rotor 201. The shaft 202 and the stator 203 fixed to a fixing plate 207 are fixed to a silicon substrate 206 through an insulation film 205, but the rotor 201 is independent of the silicon substrate and can freely be rotated around the shaft 202. When voltages of opposite charges are applied to the rotor 201 and the stators 3 respectively, the rotor 201 is attracted to the stators 203 electrostatically. By applying voltages of the same phase to a couple of stators located oppositely with an angle of 180° and rotating the phase sequentially as shown in FIG. 25 (a) by ø1, ø2 and ø3, the rotor 201 is rotated accordingly. It is possible to reverse the rotation direction of the rotor 201 by reversing the rotation direction of the phase to be applied to the stators 203.

The above polysilicon step motor can be produced to have a very minute size by a production process as explained hereinafter with reference to attached FIG. 26.

On one main surface of a silicon substrate 206, an insulation film 205 for example an oxide film or a nitride film is deposited, then on this insulation film 205 a first PSG film 211 and a first polysilicon film 210 are deposited and separation windows 208 for separating stators and a rotor are patterned in the films 210 and 211 [FIG. 26 (a)]. A second PSG film 212 is deposited and a window is opened in its center portion by patterning for a shaft [FIG. 26 (b)]. A second polysilicon film 213 is deposited and patterned to form a shaft 202 and a cap 204 [FIG. 26(c)]. The obtained device is immersed in a hydrofluoric acid solution for a long time to remove the PSG films 211 and 212 [FIG. 26 (d)], but the etching time is adjusted so that portions of the first PSG film are retained to form fixing plates 207. It is understood that from the first polysilicon film 210 the stators 203 and the rotor 201 are produced and the rotor 201 is produced to be independent of the silicon substrate 206.

As explained above, a mechanical structure made of polysilicon can be produced by a silicon IC production process and so its scale can be reduced to a very minute one. Further, mechanical elements of various different shapes can be formed on the same silicon substrate at one time by a patterning technique in the silicon IC production process and so it is not necessary to mount respective parts as in a conventional mechanical working process.

The present inventor has therefore studied the possibility of applying such technique generally to a micromotion mechanical structure and found that there are still some problems to be overcome, owing to the fact that the above technique makes use of a polysilicon thin film as a mechanical element. The problems mainly are as follows:

(1) Because a deposition rate of polysilicon deposition by sputtering is low, a time is required for producing a thick film. In an ordinary IC production process, the thickness of polysilicon film is to an extent of 1 μm or less. It is of course possible to form a thicker film if a longer time deposition can be made. However in such case, an expensive apparatus is occupied for a longer time and so the production cost becomes higher. Moreover, very large internal stress is produced in a polysilicon thick film and causes bending or cracking in the substrate. In the technique as above mentioned, some portions of the polysilicon film are finally separated from the substrate and so the polysilicon structure is all the more easily deformed by the internal stress to cause a bend to an upper or lower direction and yield serious troubles of contacting with or sticking to the substrate. In effect, a number of such troubles have already been reported as to thickness to an extent of 1 μm. For example, an article entitled "Microfabricated Structures for the Measurement of Mechanical Properties and Adhesion of Thin Films" in Digest of The 4th International Conference on Solid-State Sensors and Actuators (June 1987), pages 11–16, is referred to. Thus it is understood that it is very difficult to produce a polysilicon thick film having uniform internal stress.

(2) As mentioned in the above paragraph (1), it is in fact very difficult to produce a polysilicon thick film, but it is advantageous and so is required to make the polysilicon film as thick as possible for the following reasons:

In the above mentioned vibration-type sensor, the movable electrodes vibrate owing to electrostatic force yielded by a potential difference between the movable electrode and the fixed electrode. The electrostatic force is proportional to the cross sectional area of the opposing electrode surfaces. Accordingly, in order to obtain satisfactory electrostatic force in spite of that small cross sectional area (corresponding to the thickness to an extent of 1 μm), it is necessary to apply a high voltage. In the above mentioned vibration-type sensor, the movable electrodes are moved in the vicinity of the natural frequency and so with relatively good efficiency. If movement at frequencies remote from the natural frequency should be made, however, it would be necessary to apply a voltage of about 200–350 V.

In the above mentioned step motor, the rotor is rotated owing to electrostatic force yielded by a potential difference between the rotor and the stators, and so the situation is similar to that of the above mentioned vibration-type sensor. In effect, it is necessary to apply a voltage of about 200–350 V in the above mentioned step motor.

Such voltage as above 200–350 V is extremely high in comparison with a voltage to an extent of 10 V used in an ordinary IC and so if the above mentioned structure should be introduced, an extra coil for the high voltage would become necessary in addition to an ordinary voltage source. Hence, the size of the entire apparatus becomes very large. Accordingly, if it becomes possible to increase the thickness of the movable and the fixed electrodes in the above mentioned vibration-type sensor or of the rotor and the stators in the above mentioned step motor, that is, to obtain a thick film of thickness for example to an extent of 10 μm, the voltage to be applied can be reduced to $\frac{1}{10}$ and so it is very advantageous.

(3) Up to the present, intensive research has been made on internal stress, mechanical constants, etc. of polysilicon, but the results show that they strongly depend upon process conditions when the polysilicon is formed. Therefore, in order to design a micromotion structure comprising polysilicon, a great number of data will have to be stored, but now not yet. At this stage, it is impracticable to precisely determine an optimum design of the structure before actual production.

As it is clear from the above explanation, these difficulties are inherent to a micromotion mechanical structure comprising polysilicon, and so it has strongly been expected that a new constitution of such structure which solves the difficulties and a production process which realizes the new constitution will be developed.

SUMMARY OF THE INVENTION

An object of the present invention is therefore to present a micromotion mechanical structure made of a material which can be used in place of the polysilicon thereby to solve the above mentioned difficulties and also a process for the production thereof.

The present invention thus provides a micromotion mechanical structure comprising at least one fixed electrode and at least one movable electrode which is moved by electrostatic power applied to the fixed electrode, wherein at least one of the electrodes is formed essentially by a single crystal semiconductor material.

In one embodiment of the present invention, the fixed electrode and the movable electrode are arranged in the form of interdigitated fingers. In another embodiment of the present invention, the interdigital distance between adjacent fingers of one of the fixed electrode and the movable electrode is varied in accordance with the variation in distance from the other electrode.

The micromotion mechanical structure of the present invention can be produced by a process comprising the steps of:

(a) forming an electrode pattern of at least one of said fixed electrode and said movable electrode on a surface of a semiconductor substrate, (b) attaching the surface of the semiconductor substrate, on which said electrode pattern is formed, to a surface of a different substrate, on which the other necessary electrodes if any are formed beforehand, and (c) separating said electrode pattern from the semiconductor substrate to remain on the surface of the different substrate.

The electrode pattern may be formed in an area of said semiconductor substrate surface where a high concentration of boron is diffused in a silicon substrate, or may be formed in an area of said semiconductor substrate surface where an impurity of a type different from that of an impurity originally contained in the semiconductor substrate is diffused.

The present invention provides also a micromotion mechanical structure having at least one stopper means, that is, a structure comprising at least one fixed electrode and at least one movable electrode which is moved by electrostatic power applied to the fixed electrode, wherein at least one of the electrodes is formed essentially by a single crystal semiconductor material and at least one stopper means is provided to limit the motion of the movable electrode.

It is preferable that the stopper means is fixed to the movable electrode or the fixed electrode.

In one embodiment, the stopper means has at least one projection of a round shape on its surface which is opposite to the movable or fixed electrode and may contact a surface of the electrode.

In another embodiment, at least one concave or convex portion is provided on a surface of at least one of the movable electrodes or the stopper means so that a lift may be applied to the movable electrode when the movable electrode moves in an atmospheric fluid.

In still another embodiment, the fixed electrode may be provided only around the movable electrode, a projection may be provided in the center portion of the movable electrode, at least one fixed electrode may be hung by fixed arm means extending over the movable electrode, and either one of the fixed electrode and the movable electrode may be provided above and under the other one of the electrodes.

The micromotion mechanical structure having at least one stopper means can be produced by a process comprising the steps of:

(a) forming an electrode pattern of at least one of said fixed electrode and said movable electrode and at least one stopper means to limit the motion of the movable electrode on a surface of a semiconductor substrate.

(b) attaching the surface of the semiconductor substrate, on which said electrode pattern and said stopper means are formed, to a surface of a different substrate, on which the other necessary electrodes and stopper means if any are formed beforehand, and (c) separating said electrode pattern and stopper means from the semiconductor substrate to remain on the surface of the different substrate.

The electrode pattern may be formed in an area of said semiconductor substrate surface where a high concentration of boron is diffused in a silicon substrate, or may be formed in an area of said semiconductor substrate surface where an impurity of a type different from that of an impurity originally contained in the semiconductor substrate is diffused.

The stopper means may be formed after the electrode pattern is formed by providing trenches on the surface of the semiconductor substrate and the trenches are filled by a semiconductor material, and then, the semiconductor material filled in the trenches is removed.

The micromotion mechanical structure of the present invention can be used for various purposes, for example, for installing a thin film magnetic head or a laser disc head, or for constituting a step motor, etc.

In the micromotion mechanical structure of the present invention, the movable electrode and the fixed electrode are constituted by a single crystal semiconductor material. The single crystal has uniform mechanical properties, its internal stress is very small and sufficient data are already known and available as to its mechanical properties, differently from the case of the deposited polysilicon thick film. The single crystal, however, as it is, is too thick to produce a minute micromotion mechanical structure. According to the process of the present invention, it becomes possible to make use of such a thick single crystal material by patterning an electrode thereon, retaining the patterned electrode constitution of another substrate by attaching the patterned surface of the single crystal substrate to a surface of another substrate, and then thinning the single crystal substrate. Since the patterned electrode constitution can be retained even after thinning by etching, it is not necessary to mechanically and individually mount various elements of electrodes on a substrate. Thus it becomes possible to realize a micromotion mechanical structure having uniform mechanical properties and to obtain the same in a very easy manner. By appropriately designing the constitution and combination of the movable electrode and the fixed electrodes and the electrostatic driving method by voltage application to them, it becomes possible to realize various micromotion mechanical structures and their precise control, with high quality control and in an easy manner.

DESCRIPTION OF THE PREFERRED EMBODIMENTS

The present invention will be explained below further in detail with respect to some embodiments.

Figure 1:
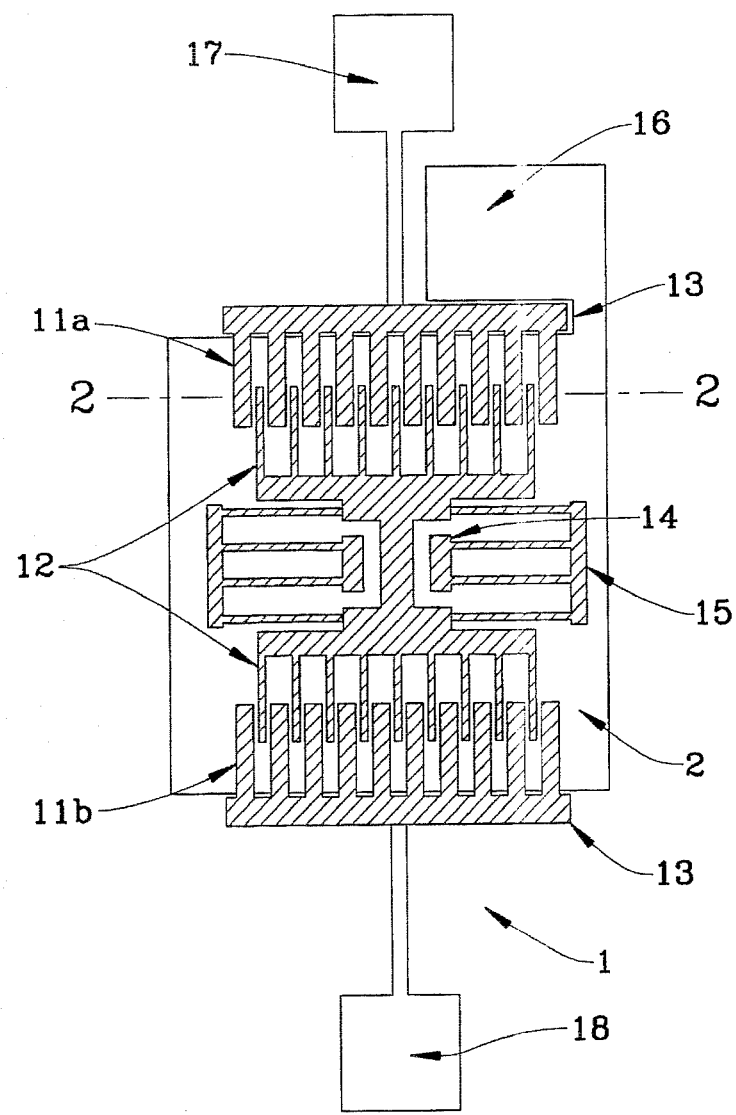
FIG. 1 shows a plan view of a vibration-type sensor as a first embodiment of the micromotion mechanical structure of the present invention.
Figure 9:
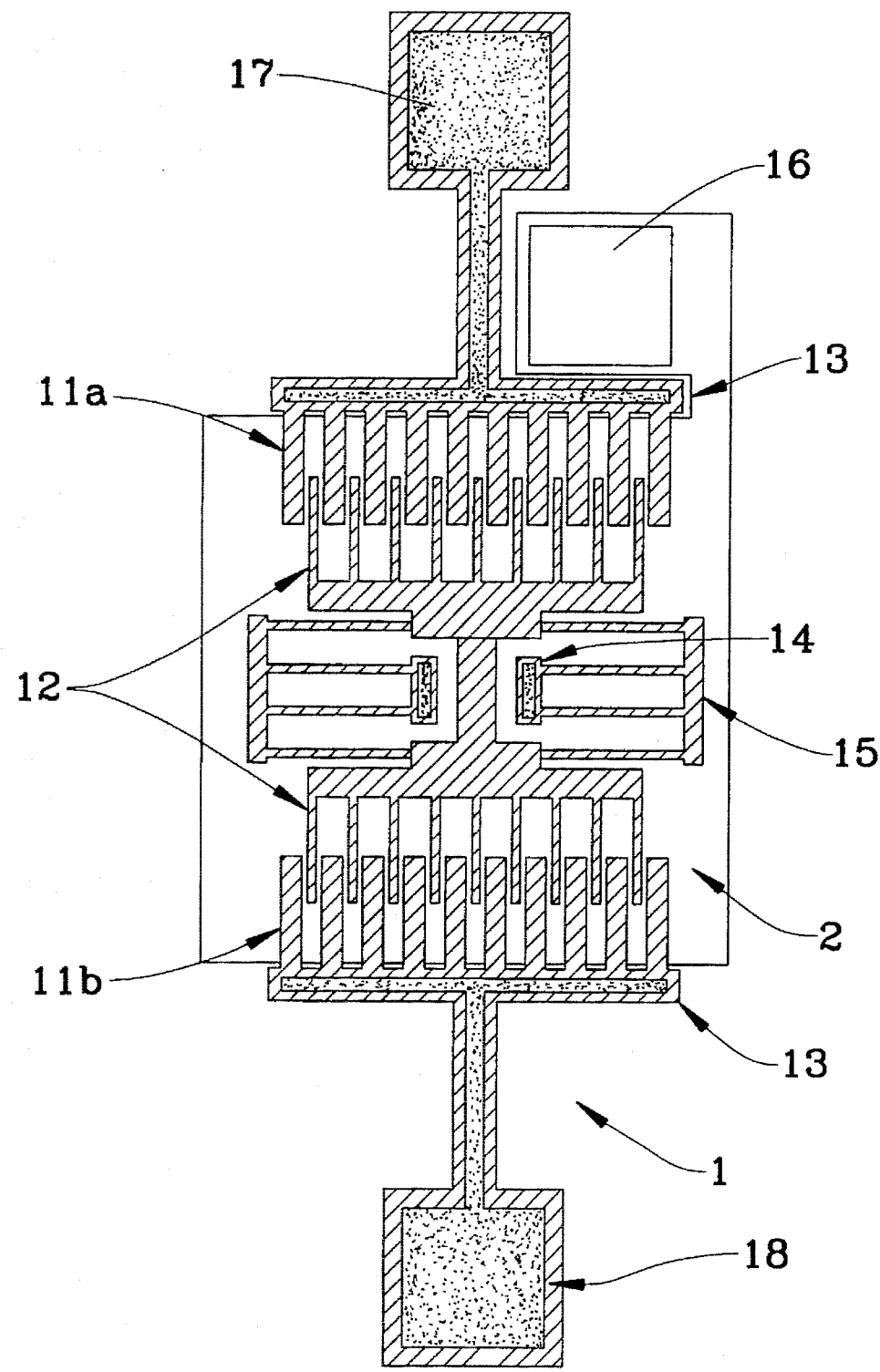
FIG. 9 shows a plan view of a prior art vibration-type sensor.
Figure 10A:
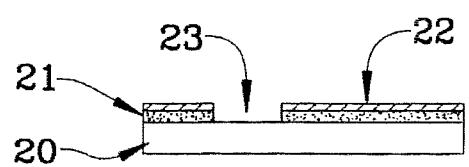
FIG. 10 shows process steps for producing the sensor of FIG. 9 in accordance with prior art.
Figure 10D:
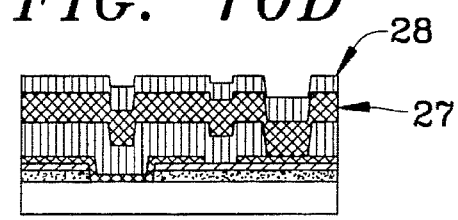
Figure 10B:
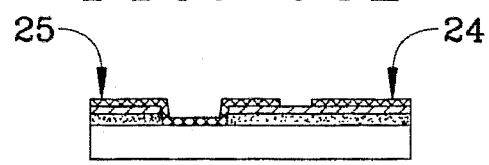
Figure 10E:
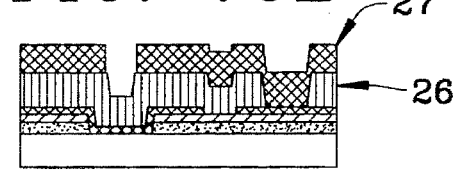
Figure 10C:
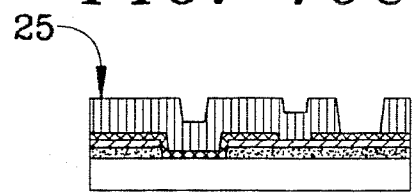
Figure 10F:
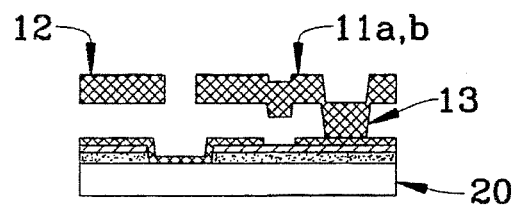

In FIG. 1, a vibration-type sensor of the present invention is shown. The illustration in FIG. 1 is similar to that of the prior art sensor shown in FIG. 9, but the material and construction are totally different between them. Numerals used for identifying the constitutional elements are common to FIG. 1 and FIG. 9, as long as the elements have similar functions.

The sensor of FIG. 1 has fixed electrodes 11a and 11b and a movable electrode 12 both being made of single crystal silicon of 10 µm thickness and suspended on a glass substrate 1. The movable electrode 12 is supported by supporting plates 14 through folded beams 15 which also are made of single crystal silicon and suspended on the glass substrate 1. The fixed electrodes 11a and 11b are supported by fixing plates 13. Because these electrodes 11a, 11b and 12, folded beams 15, fixing plates 13 and supporting plates 14 are produced from the same silicon substrate, they have materially the same mechanical properties, individually uniform internal structure and very small internal stress. In order to supply voltages to the electrodes, metal pads 16, 17 and 18 are selectively formed on the glass substrate 1, so that electrical connections to the fixing plates 13 and the fixing plates 14 may be formed together. These metal pads are ordinarily made of plural metals such as chromium-gold, titanium-platinum-gold. By providing a ground electrode 2 which is connected to the pad 16 and widely expanded to surround the movable electrode 12, it is possible to stabilize the voltages of the electrodes and reduce external noises. The fixed electrodes 11a and 11b have similar comb teeth shapes interdigitated with each other. To the movable electrode 12, an earth voltage is applied by the pad 16 through the ground electrode 2. To the fixed electrodes 11a and 11b, two phase alternating voltages consisting of a voltage equal to the earth voltage and a different voltage to an extent of 10 V are applied so that the electrodes 11a and 11b have phases opposite to each other. The movable electrode 12 is electrostatically attracted by one of the fixed electrodes 11a and 11b that has the voltage different from the earth voltage in proportion to potential difference, but not by the other one of the fixed electrodes of the earth voltage. Since the voltage condition is switched alternately between the fixed electrodes 11a and 11b, the movable electrode 12 vibrates at a rate proportional to the switching rate. Owing to the thickness of the electrodes which amounts to 10 µm and is much larger than the prior art, sufficient vibration occurs even at a lower voltage to an extent of 10 V. The largest amplitude of vibration can be obtained at a natural frequency of a system constituted by the movable electrode 12, folded beams 15 and the supporting plates 14. It is possible to produce either one of the movable electrode and the fixed electrode from polysilicon. For example, if the fixed electrodes are made from polysilicon of 1 µm thickness and the movable electrode from single crystal silicon of 10 µm thickness, electric lines of force between them become parallel in comparison with a case wherein both electrodes are made from polysilicon and so the design of the device becomes easier.

In order to improve the reliability of the sensor in a serious condition such as high humidity, it is possible to deposit an insulation film such as an oxide film or a nitride film on the patterned metal wiring so that leak current may be reduced even at such serious condition. Owing to the glass substrate which is a complete insulator, it is possible to disregard any influence of electric lines of force by the substrate when the device is driven. The device therefore can be designed in consideration only of electric lines of force between the fixed electrodes and the movable electrode and so analysis and scaling of the device can be much simplified.

It is however possible to attach the silicon substrate to another silicon substrate. In this case, electric lines of force in the device become complicated, but it becomes easier to form complicated shapes such as concave or convex shapes in the silicon substrate. For example, it is possible to form the fixed electrodes on one silicon substrate and the movable electrode on another silicon substrate and join them by a silicon-silicon direct bonding method.

Figure 2A:
FIG. 2 shows process steps for producing the sensor shown in FIG. 1.
Figure 2B:
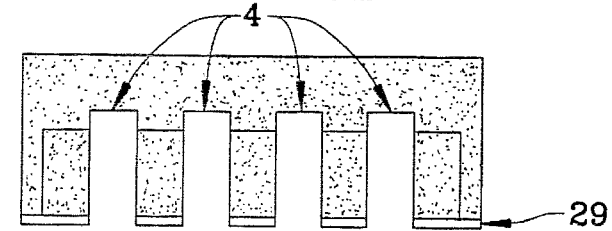
Figure 2C:
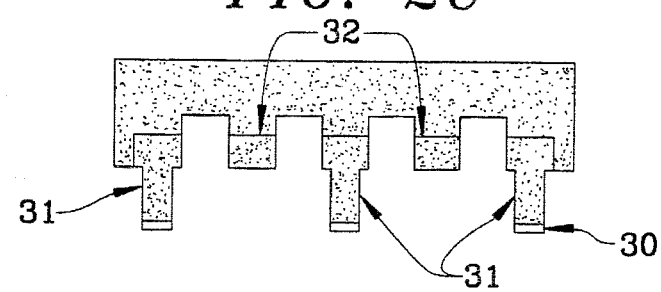

FIG. 2(a) to FIG. 2(c) illustrate a process for the production of the device shown in FIG. 1, by cross sections along line 2—2 in FIG. 1. On a silicon single crystal substrate 20, an oxide film 21 is formed and partly removed. From the area where the oxide film is partly removed, a high concentration of boron is diffused into the substrate to form a boron diffusion layer 3 [FIG. 2(a)]. The oxide film 21 is removed from the entire surface and then again an oxide film 29 is formed and partly removed. By using this oxide film 29 as a mask, the boron diffusion layer 3 is etched up to the silicon substrate 20 to form trenches 4 [FIG. 2(b)]. These trenches 4 can be formed in any cross sectional shape such as circular shape if dry etching Reactive Ion Etching (RIE) is employed. In a case of an orthogonal shape as in the case of FIG. 1, trenches 4 surrounded by vertical walls as shown in FIG. 2(b) can be formed by a wet etching process by selecting surface direction of the silicon substrate 20 to be (110) and using an anisotropic etching solution such as ethylenediamine pyrocatechol (EDP). The oxide film 29 is patterned to form an oxide film 30 and then using this oxide film 30 as a mask, the boron diffusion layer 3 and the silicon substrate 20 are etched as shown in FIG. 2(c). By these three time masking steps, fixed electrodes 31 and a movable electrode 32 are formed. Next, the oxide film 30 is removed and the fixed electrodes 31 are bonded to a glass substrate and an electrostatic bonding method. The movable electrode 32 is not shown in FIG. 2(c), but it is suspended on the glass substrate through a supporting plate provided in a direction vertical to the sheet of the drawing of FIG. 2(c). On the glass substrate, combined metal layers of chromium-gold, titanium-platinum-gold, etc. are selectively patterned beforehand to form the pads and the ground electrode as shown in FIG. 1. Electric conduction between the metal layers and the fixed electrodes and the movable electrodes consisting of the boron diffusion layer is obtained by making use of adhesion of silicon to glass and by mechanically pressing the boron diffusion layer to the metal layer, and so no particular adhesive is required. Finally the obtained device comprising the silicon substrate and the glass substrate are immersed in an etching solution such as EDP to remove the silicon substrate 20. The etching solution such as EDP has a property that dissolves a silicon substrate but leaves a layer wherein boron is diffused in a high concentration. Also a glass substrate and metals such as gold are left without dissolution.

In the above mentioned process, it is possible to easily change the thickness of the fixed electrodes and the movable electrode from about 1 μm to about some 10 μm by changing the temperature and the time of the boron diffusion. Since the boron diffusion layer consists of single crystal silicon, its mechanical property is uniform and its internal stress is small. Therefore, even in such large thickness, the fixed electrodes and the movable electrodes are not deformed or bent, differently from the prior art polysilicon thick film electrodes.

Further, in the prior art production process, another masking step for contact is necessary in addition to the four masking steps shown in FIG. 10, that is, a total of five masking steps is necessary. On the other hand, in the process of the present invention, only four masking steps, three for the silicon substrate and one for the glass substrate, are required, and so production is easier.

The boron diffusion is performed first in the above, but in place may be performed after the steps of FIG. 2(b) and FIG. 2(c). Further, the order of the steps of FIG. 2(b) and FIG. 2(c) may be reversed.

In the above process, etching stop is made by the high concentration boron diffusion in the silicon substrate, but it is also effective to make use of an electrochemical etching stop method, which stops etching by applying electrostatic voltage to a layer wherein an impurity different from the original impurity in the substrate is diffused. For carrying out the latter method, for example, the layer 3 in FIG. 2(a) may be an n-type diffusion layer and the substrate may be a p-type. In order to make the entire impurity layer have the same potential upon etching stop, it is recommended to short-circuit the metal wirings on the glass substrate outside the device, and after completion of etching, to cut the short circuit for example at the time of cutting into chips.

Figure 3:
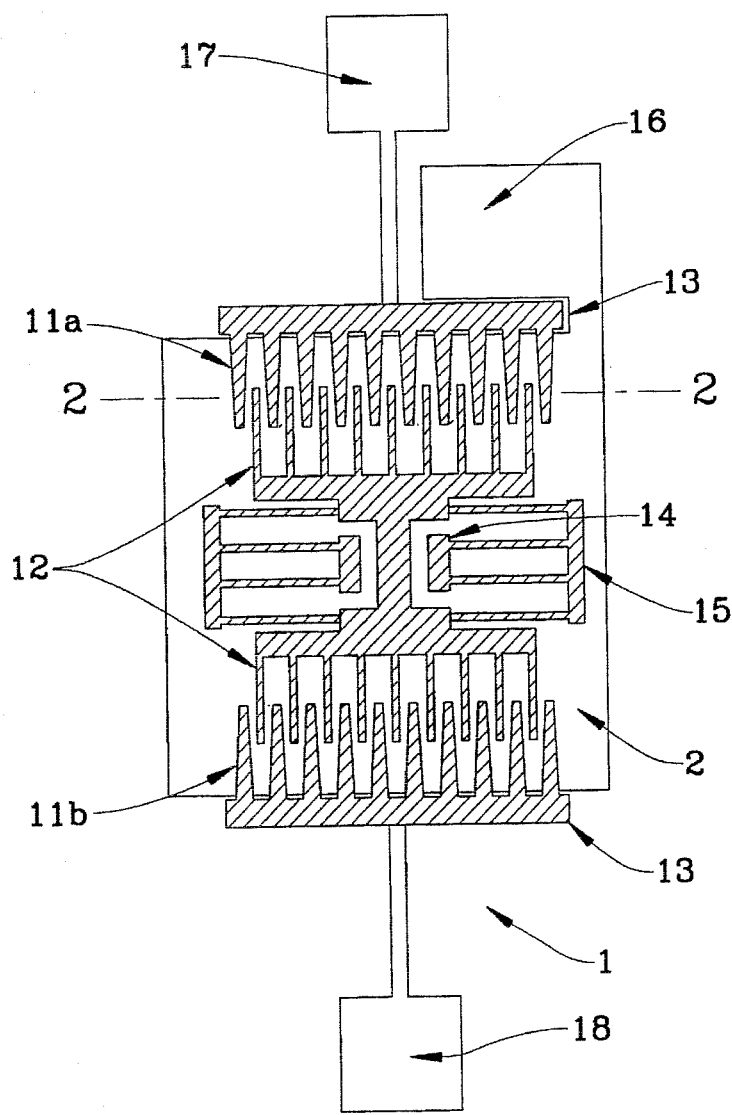
FIGS. 3, 4 and 5 respectively show plan views of vibration-type sensors as second to fourth embodiments of the present invention.

FIG. 3 shows another embodiment of the present invention. In FIG. 3, constitutional elements having the same reference numbers as those shown in FIG. 1 indicate the same constitutional elements shown in FIG. 1. The constitution of FIG. 3 is the same as that shown in FIG. 1 except for the constitution of the fixed electrodes 11. In this second embodiment, the width of the comb teeth of the fixed electrodes 11a and 11b is made wider from their top ends to their base ends, that is, toward the fixed plates 13. In other words, the distance between the electrode comb teeth is made narrower as the distance from the movable electrodes increases. As explained in the first embodiments, the force acting on the movable electrode 12 is in proportion to the voltage applied to the fixed electrode 11. This electrostatic force is also in proportion to a distance between the fixed electrodes and the movable electrodes. In the first embodiment shown in FIG. 1, the distance between the fixed electrodes and the movable electrodes is constant and so the electrostatic force acting on a unit length of the movable electrode is constant, irrespective of the movement of the movable electrode. On the other hand, in this second embodiment shown in FIG. 3, the distance between the fixed electrodes and the movable electrode varies in accordance with the movement of the movable electrodes, and so the electrostatic force acting on the unit length of the movable electrode also varies in accordance therewith, that is, increases in inverse proportion to the distance between both electrodes. Accordingly, the movable electrode tends to go into the depth of the fixed electrodes. Therefore, this second embodiment has merit over the first embodiment in that the device can be driven by a smaller force. The movement of the movable electrode toward the fixed electrodes is balanced by the opposite force given by the stiffness of the folded beams 15 and is stopped in the meantime. This movement can be varied by changing structural elements of the width of individual comb teeth of the fixed electrodes 11a and 11b and the stiffness of the folded beams, and so the degree of freedom in design of the device is increased in comparison with the structure of the first embodiment. In this second embodiment, the width of the fixed electrode comb teeth is varied, but the same effect can be obtained by varying the width of the movable electrode comb teeth. Of course, it is possible to vary the widths of the comb teeth of both electrodes.

Figure 4:
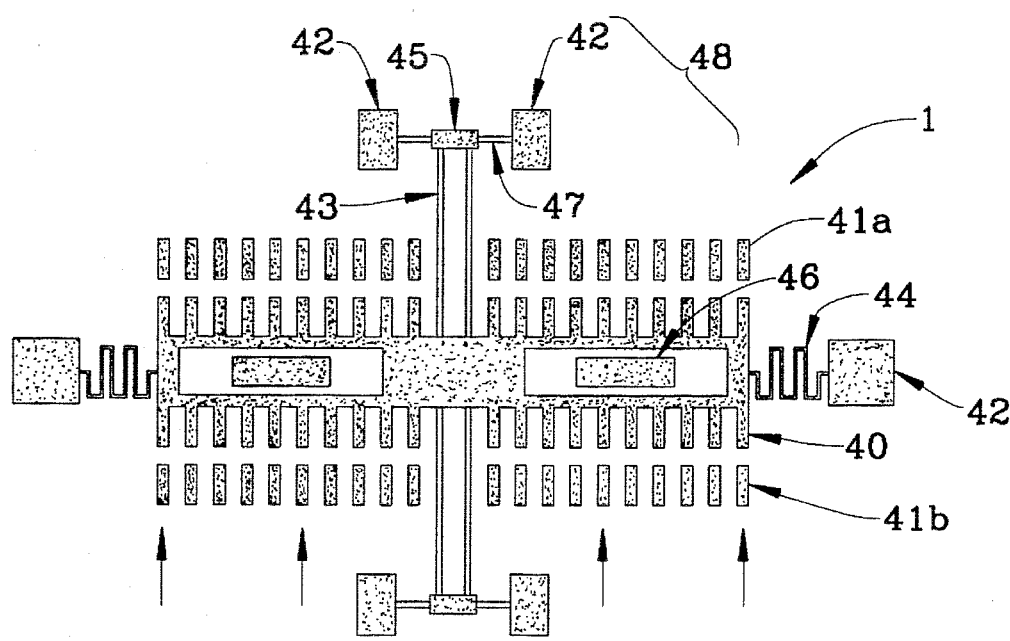

FIG. 4 shows still another embodiment of the present invention. In FIG. 4, constitutional elements having the same reference numbers as those shown in FIG. 1 indicate the same constitutional elements shown in FIG. 1. In this third embodiment, a movable electrode 40 and fixed electrodes 41a and 41b located on both sides of the movable electrode 40 are arranged opposite to each other without being interdigitated with each other, differently from the first embodiment. Further, in this third embodiment, a pitch of electrode comb teeth is made different between the movable electrode 40 and the fixed electrodes 41a and 41b. As shown by four arrows in FIG. 4, the positions of the electrode comb teeth of both electrodes are made the same at four points in the upper and lower sides of the movable electrodes 40 in this third embodiment. Folded beams 44 are located at right and left sides of the movable electrode 40, fixed at their one end to the movable electrode 40 and supported at their other end by supporting plates 42 fixed to the glass substrate 1 so that they are suspended on the substrate. The movable electrode 40 thus floats on the substrate. The movable electrode is supported on the substrate also at its center portion by a buffer structure 48 comprising straight beams 43 and 47 and connection plates 45. This buffer structure 48 and the folded beams 44 have a function of supporting the movable electrode 40 mentioned as above and other two functions as mentioned hereinafter. First, when the movable electrode 40 moves in the right and left directions in FIG. 4, the folded beams 44 and straight beams 43 tend to restrain the movements and return the movable electrode 40 to its original position, by restoring the force yielded by deformation of them. Second, they are fixed at their one end to the substrate through supporting plates 42 and so the movable electrode is less influenced by stress such as heat and humidity produced in contact surfaces between the substrate and the supporting plates. Further, repeating structure in the folded beams 44 and orthogonal structure of the straight beams connected by the movable connection plates 45 serve to reduce the influence of stress in the beams by deformation of the buffer structure 48 and the folded beams 44.

In this third embodiment, the movable electrode 40 moves in the right and left directions in FIG. 4 in accordance with the variation of voltage applied to the fixed electrodes 41a and 41b. In order to limit this movement only to one dimension of the right and left direction, slider projections 46 fixed to the substrate 1 are provided. Even if the movable electrode 40 is driven in the up and down direction in FIG. 4 for any reasons, the movable electrode 40 is in contact with these slider projections 46 and so is prevented from any vertical movement. It is possible to apply independently different voltages to individual comb teeth of the fixed electrodes 41a and 41b. In this third embodiment, however, the comb teeth of the couple of the fixed electrodes 41 and 41b sandwiching the movable electrode 40 are made to have a voltage different from a voltage of the movable electrode 40 only in every six selected teeth. To other non-selected teeth of the fixed electrodes 41a and 41b, a voltage the same as that of the movable electrode is applied. As shown in FIG. 4, the distance of every six teeth of the fixed electrodes 41a and 41b is made the same as that of every five teeth of the movable electrode 40. Electrostatic force acts only between teeth of the fixed electrodes and the movable electrodes having different voltages, and so the movable electrode moves to a position where positions of the teeth of the movable electrodes coincide with those of the teeth of the fixed electrodes to which the different voltage is applied, owing to the balance of force conditions. By applying a voltage sequentially scanning adjacent teeth of the fixed electrodes, it is possible to move the movable electrode in the scanning direction.

It is possible to detect displacement of the movable electrode 40 by detecting the position of a part of the movable electrode by a portion of the fixed electrodes. Such detection can be made for example by providing a circuit detecting electric capacitance between a tooth of the fixed electrodes, to which a driving voltage is not applied, and a tooth of the movable electrode; or by providing the fixed electrodes with means for emitting a laser beam toward the movable electrode and detecting a beam reflected therefrom. By feeding back the signal indicating the position of the movable electrode to a drive circuit of the fixed electrode, it becomes possible to control the movement of the movable electrode in a more precise manner.

Figure 5:
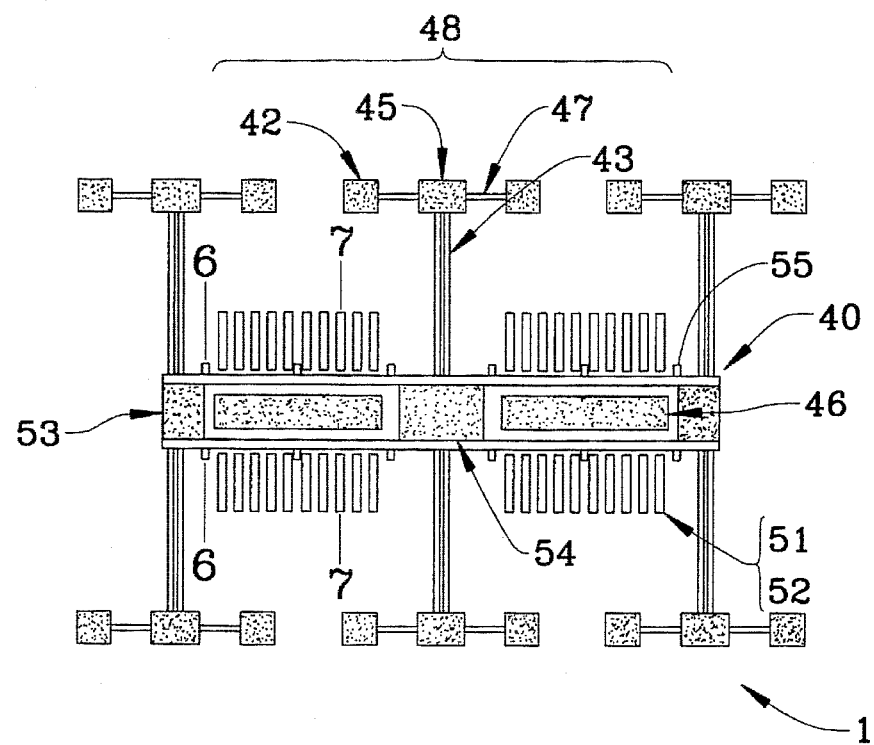

FIG. 5 shows still another embodiment of the present invention. In FIG. 5, constitutional elements having reference numbers same as those of FIG. 4 have meanings the same as those of FIG. 4. The device shown in FIG. 5 is different from the device shown in FIG. 4 as to the structure of the fixed electrodes. In this fourth embodiment, two sets of fixed electrodes are provided, one set of the fixed electrodes 51 at the side of the silicon substrate (not shown) and the other set of the fixed electrodes 52 at the side of the glass substrate 1. The movable electrode 40 moves in a space provided between the glass substrate 1 and the silicon substrate, by applying a voltage to the fixed electrodes 51 and 52 between which teeth 55 of the movable electrode 40 are positioned. To a couple of teeth of the fixed electrodes standing at positions vertically opposite to each other, the same voltage is supplied and the movable electrode 40 is moved in the right and left horizontal direction by the driving method mentioned in the third embodiment. The minimum distance of movement of the movable electrode is decided by the pitch of the fixed electrodes. It is possible to apply a voltage between the fixed electrodes 51 and 52 in a direction reverse to any wave movement of the movable electrode 40 in addition to the voltage necessary for the horizontal movement of the movable electrode 40.

Figure 6A:
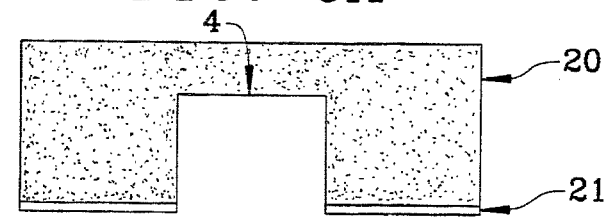
FIGS. 6 and 7 respectively show cross sections along lines 6—6 and 7—7 shown in FIG. 5.
Figure 6B:
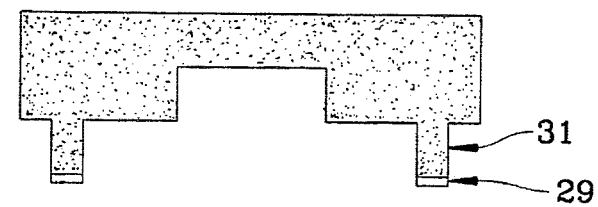
Figure 6C:
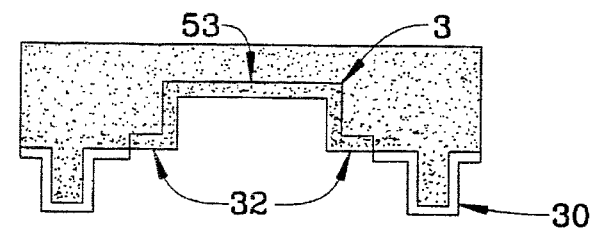
Figure 7A:
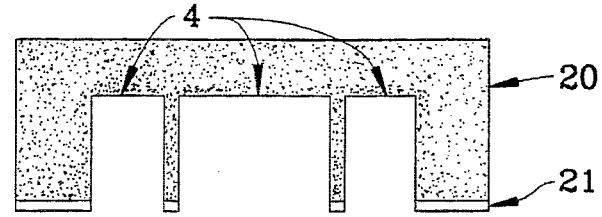
Figure 7B:
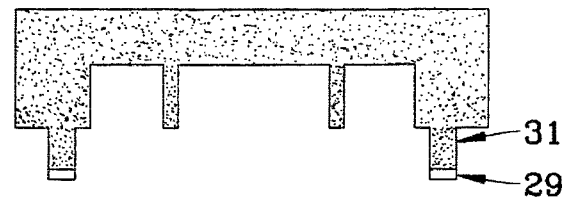
Figure 7C:
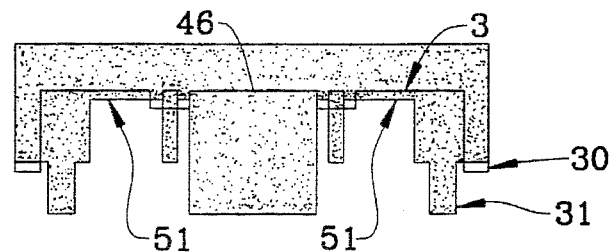

FIG. 6 illustrates a cross section along a line 6—6 in FIG. 5 and a process for the production thereof; and FIG. 7 illustrates a cross section along a line 7—7 in FIG. 5 and a process for the production thereof. In these FIGS. 6 and 7, constitutional elements having reference numbers the same as those shown in FIG. 2 indicates constitutional elements the same as those of FIG. 2. First, deep grooves 4 are formed [FIG. 6(a) and FIG. 7(a)] and then shallow etching is carried out to leave supporting plates (not shown) and fixing plates 31 [FIG. 6(b) and FIG. 7(b)]. Finally, boron is diffused to form a movable electrode 32 [FIG. 6(c)] and fixed electrodes 51 [FIG. 7(c)]. To a glass substrate (not shown) on which the fixed electrode 52 is formed by a metal beforehand, the silicon substrate is bonded by an electrostatic bonding method and then regions of the silicon substrate wherein boron is not diffused are removed by wet etching. It is possible to widen a movable area of the movable electrode 40 in FIG. 5, by producing end flat portions 53 in both ends and center flat portion 54 in the center of the movable electrodes 40 to have a height the same as that of the fixed electrodes 51 so that these flat portions do not contact with the slider projections 46 when the movable electrode 40 moves horizontally.

Figure 8:
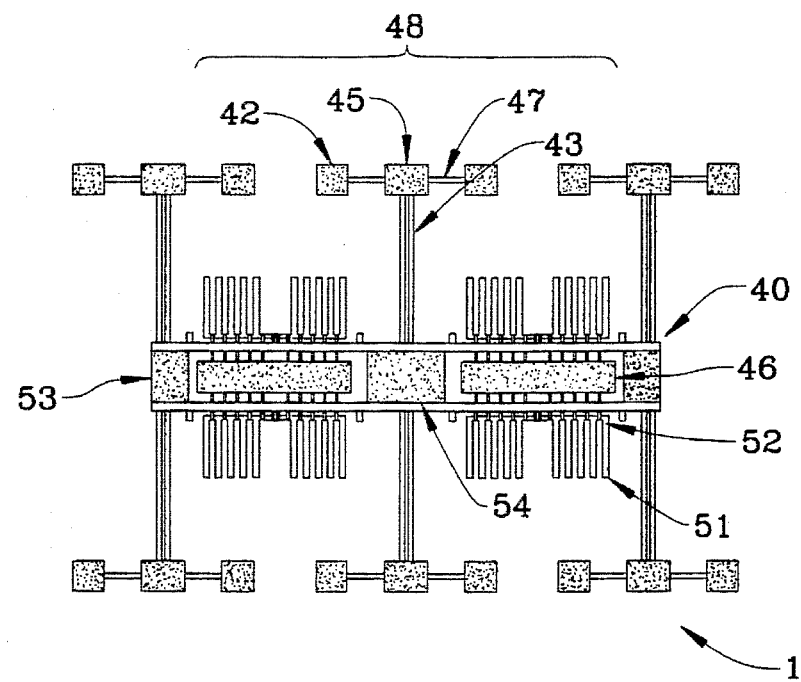
FIG. 8 shows a plan view of a vibration-type sensor as a fifth embodiment of the present invention.

FIG. 8 shows still another embodiment of the present invention. In FIG. 8, constitutional elements having reference numbers the same as those given in FIG. 5 have the same meanings given in FIG. 5. The structure shown in FIG. 8 is different from the structure of FIG. 5 as to the structure of the fixed electrodes. Namely, in this fifth embodiment, the fixed electrodes 51 provided in the silicon substrate and the fixed electrodes 52 provided in the glass substrate are arranged with a gap corresponding to about one half of their pitch width and the voltage is applied in the order of silicon side, glass side and silicon side electrodes. Then the movable electrode 40 moves to follow the position of the teeth of the fixed electrodes to which the voltage is applied. This structure has merit in that the movable electrode can be controlled with precision corresponding to one half of the pitch of the fixed electrodes. It is also possible to add another set of the fixed electrodes to the same height level as that of the movable electrode shown in FIG. 4 and to drive these three sets of fixed electrodes in the order for example of the upper electrodes, side electrodes and lower electrodes, etc. In such case, it is possible to drive the movable electrode with precision corresponding to one third of the pitch of the fixed electrodes, by arranging the three sets of fixed electrodes with a gap corresponding to one third of their width.

As above, embodiments of the present invention are explained as to construction production process of linear actuators movable in one dimension. Such actuators as they stand are usable as a vibration-type sensor mentioned above with reference to the prior art. It is possible to produce a minute magnetic head by depositing and patterning a thin film head comprising a magnetic body such as ferrite on a center flat portion of the movable electrode 40 in FIG. 4 or on a center flat portion 54 of the movable electrode 40 in FIG. 5 or FIG. 8 by a known method. For producing such a thin film head, it is also possible to employ means for directly illustrating patterns on the device by a laser CVD technique, etc. On the other hand, it is also possible to produce a minute laser head by installing an optical fiber on light emitting and light receiving elements. Although the present invention is explained as to electrostatic driving, it is possible to constitute the fixed electrodes by a coil, etc. to drive the movable electrode by electro-magnetic force. Moreover, the above actuators are not limited only to linear actuators but can easily be applied to actuators for circular movement, for example, by arranging fixed electrodes on a circle surrounding a circular shape movable electrode.

In the above embodiments, the single crystal silicon used for constituting electrodes are produced from silicon substrate, but it is clear that single crystal silicon formed by vapor phase or selective epitaxial growth technique or by laser annealing technique on a glass substrate, a sapphire substrate or semiconductor substrate having an insulation film formed on its surface may be used.

Moreover, although in the embodiments shown in FIGS. 3–8, all electrodes are formed by a single crystal semiconductor material, it is possible to use polysilicon for one or more electrodes.

Figure 11:
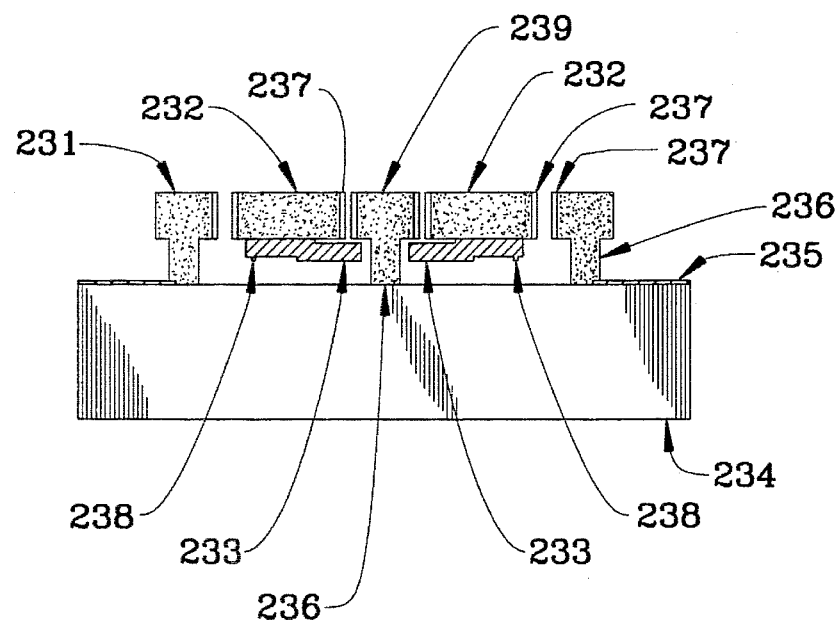
FIG. 11 shows a cross section of a step motor as a sixth embodiment of the present invention.

A micromotion mechanical structure according to the present invention which is similar to a conventional structure will now be described with reference to a sectional view shown in FIG. 11. In FIG. 11 peripheral fixed electrodes 231, a central fixed electrode 239 and movable electrode 232 are made of single crystal silicon and are 10 μm thick, respectively. Upon rotation, the movable electrode 232 moves in the floating state in relation to a glass substrate 234. On the other hand, the fixed electrodes 231 and 239 are fixed on the glass substrate 234 by fixing pads 236 made of silicon. The under surface of the movable electrode 232 is provided with stopper means 233 which are secured to the electrode 232. The inner edge of each stopper means 233 overlaps with a part of the under surface of the central fixed electrode 239. therefore, the movable electrode 232 can be prevented from separating upwardly from the fixed electrode 239. The movable electrode 232 can be prevented from moving downwardly by engagement between the stopper means 233 and the upper surface of the glass substrate 234. Therefore, the movable electrode 232 is always kept within a narrow range above the glass substrate 234. In order to reduce the friction produced between the stopper means 233 and the glass substrate 234 when the movable electrode 232 rotates above the substrate 234, each stopper means 233 is provided with contacting projections 238 for decreasing the contact area. In order to prevent electrical short circuit between the fixed electrodes 231 and the movable electrode 232, insulating walls 237 are provided between the side walls of the fixed electrodes 231 and the movable electrode 232. And the side wall of the central fixed electrode 239 is also provided with the insulating wall 237. The insulating walls 237 also perform the function of the lubrication film when the movable electrode 232 contacts with the central fixed electrode 239. All of the fixed electrodes 231 and 239, the movable electrode 232 and the fixing pads 236 are made of the same silicon substrate. Therefore, it is the main characteristics of the structures that they have mechanical properties approximating each other. Further, since the structure is made of single crystal, the mechanical properties of the individual internal composition are very uniform so that the internal stresses are low. A load wire 235 for supplying a driving voltage to the fixed electrodes 231 is formed on the glass substrate 234 by selective forming of metals. The lead wire 235 is engaged with a part of the pad 236 so as to be electrically connected thereto. And it is not shown that the central fixed electrode 239 is also connected to the lead wire 235 so as to supply an earth voltage to the movable electrode 232 through the fixed electrodes 239. The movable electrode 232 is connected to the fixed electrode 239 through the side insulating wall 237 of the side wall thereof. However, the potential of the movable electrode 232 equals that of the fixed electrode 239, that is, the earth voltage because the movable electrode 232 is floating electrically. Usually, metallic electrodes are composed of a plurality of metallic films such as chromium-gold, titanium-platinum-gold and the like. On the other hand, a two-phase alternating voltage composed of voltage equal to the earth voltage and a different voltage (about 10 V) is applied to the peripheral fixed electrode 231 so as to be scanned for rotating successively around the movable electrode 232. Since the thickness of the fixed and movable electrodes is 10 μm and is thicker than that of the conventional ones, the alternating voltage rotates sufficiently even though it is such a low value as 10 V. There produces no force between the movable electrode 232 and the fixed electrode 231 having the earth voltage, while there produces the electrostatic force proportional to the potential difference between the electrode 232 and the other fixed electrode. Therefore, the movable electrode displaces toward the fixed electrode having the voltage different from the earth voltage. Since the condition changes along the circumference to successively rotate, the movable electrode rotates in proportion to the changing speed. In the embodiment in FIG. 11, all the electrodes are made of single crystal silicon. However, either the fixed electrode 231 or the movable electrode 232 may be made of polysilicon. When the fixed electrodes 231 are made of single crystal Si having the thickness of 10 μm and the movable electrode 232 is made of polysilicon having the thickness of 1 μm, it is easier to design, etc. compared to the case where both electrodes are made of polysilicon having the thickness of 1 μm because the electric lines of force produced between both electrodes are parallel to each other.

In the structure according to the embodiment of the invention, a large electric field is produced at small areas because the structure is driven by the electrostatic force. Therefore there arises a problem that current leakage is produced along the glass surface between different metallic lead wires if the device is exposed to an inferior environment such as high humidity. It is possible to suppress the leakage current along the glass substrate to be low by depositing the insulating film such as oxide film, nitride film and so on over the metallic lead wires with sputtering, etc. after patterning of the lead wires. It is noticeable that the structure according to the embodiment of FIG. 11 is arranged on the glass substrate. Since the glass substrate is a perfect insulating material differently to a silicon substrate, the parasitic capacity does not produce through the substrate between the movable and the fixed electrodes 232 and 231, respectively, Therefore, there produces an electrostatic force, which is equal to the potential difference supplied to the fixed electrode 231, between both electrodes 232 and 321. This is useful for remarkably improving the efficiency of the device compared to the conventional structure. Since the influence of the electric lines of force produced through the substrate upon driving can be fully neglected, it is possible to design the device in consideration of only the electric lines of force between the fixed electrodes and the movable electrode. Thus, analysis and scaling of the device can be remarkably simplified. Though the structure in which the silicon substrate was affixed to the glass substrate has been explained in this embodiment, the structure in which the silicon substrate is affixed to the other silicon substrate falls also in the range of the present invention. Since the silicon substrate is an imperfect insulating material compared to the glass substrate, the electric lines of force within the device become complicated. On the other hand, since it is possible to easily form irregular shapes within the silicon substrate, a complex structure different from this embodiment can be fabricated. For example, the device can also be constituted by forming a movable electrode on one silicon substrate and fixed electrodes on the other silicon substrate in accordance with the production method of the present invention and bonding these substrates to each other with a silicon-silicon direct joining method.

Figure 12A:
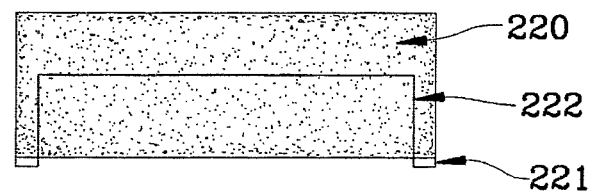
FIG. 12 shows process steps for producing the step motor shown in FIG. 11.
Figure 12B:
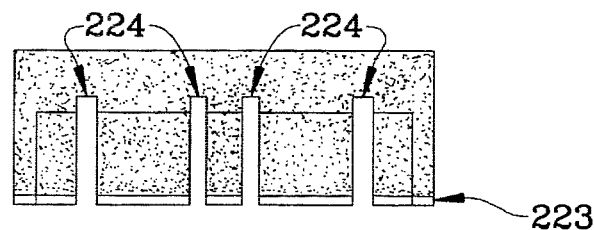
Figure 12C:
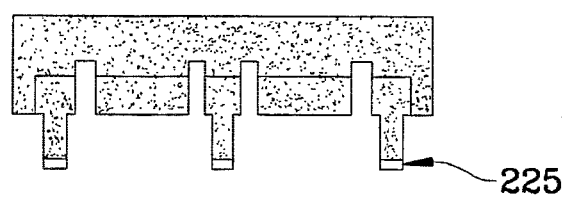
Figure 12D:
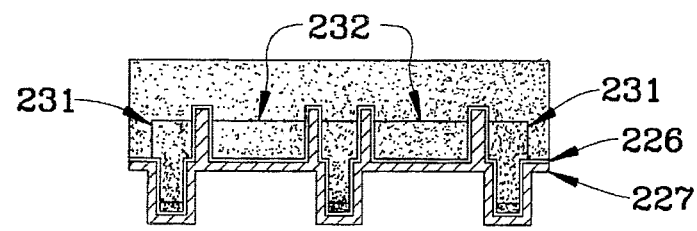
Figure 12E:
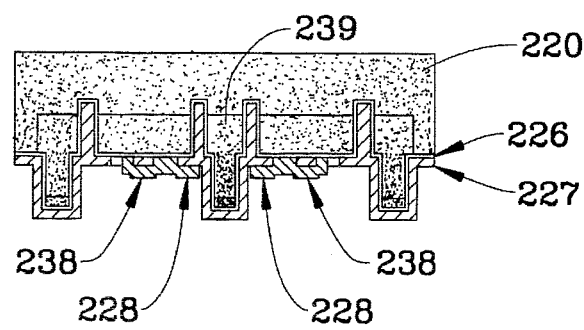

An embodiment for a method for production of a motor shown in FIG. 11 will now be described with reference to FIG. 12. Oxide films 221 are formed on a substrate 220 made of a single crystal, and a boron diffusion layer 22 is formed by diffusing a high concentration of boron from an area from which the oxide films 221 are partially removed (FIG. 12(a)). After the oxide films 221 are removed from the total surface of the substrate, other oxide films 223 are formed again. And after the oxide films 223 are also partially removed, trenches 224 are formed by etching the boron diffusion layer 222 up to the silicon substrate 220 by the use of the oxide films 223 as a mask (FIG. 12(b)). The trenches 224 can be formed to have an arbitrary cross section such as circular, etc. By the use of dry etching, RIE (Reactive Ion Etching), etc. when the electrode having only simple polygonal shapes is formed; the face orientation of the silicon substrate is selected to be (110) to that the trenches 224 which are surrounded by perpendicular walls as shown in FIG. 12(b) can be formed by the technique of a wet etching process in which an anisotropic etching solution such as EDP (ethylene-diamine pyrocatechol) is used. Oxide films 225 are formed by patterning the oxide films 223. The etching process of the boron diffusion layer 222 and the silicon substrate is performed by the use of the oxide films 225 as a mask as shown in FIG. 12(c). Then, after the oxide films 224 are removed to form an oxide film 225 over the total surface, the trenches 224 are filled in with a polysilicon films 227 (FIG. 12(d)). The oxide film 226 is useful in preventing boron from diffusing outwardly from the boron diffusion layer 222. Openings for stopper means 228 are formed in the polysilicon film. Patterning of the stopper means 228 is performed by depositing an oxide film and a nitride film (FIG. 12(e)). In this case contact pads 238 are also formed. The compound films composed of the oxide film and the nitride film becomes the cause of deformation of the stopper means due to the larger stress produced in the compound film. In order to reduce the deformation, it is desired to make the thickness ratio of the oxide film and the nitride film between 4 to 1 and 2 to 1. And it is also useful for reduction of the internal stress to anneal the compound film between about 900° C. and about 1100° C. Thereafter, the polysilicon film 227 and the oxide film 226 of the bottom surface of the fixed electrodes 231 and 239 are removed and the electrodes 231 and 239 are made to adhere to the glass substrate (not shown) with electrostatic adhesion methods. Patterning of a compound metal layer such as chromium-gold or titanium-platinum-gold is selectively performed beforehand so as to form the lead wire 235 of FIG. 11. The compound metal layer is connected to the fixed electrode made of the boron diffusion layer by utilizing the joining force between the silicon and the glass. Since continuity is achieved by directly pressing the boron diffusion layer against the metal layer physically, adhesives are not required. Finally the obtained device comprising the silicon substrate and the glass substrate made to adhere to each other is immersed in an etching solution such as EDP, etc., to remove the silicon substrate 220 and the polysilicon 227, and the oxide film 226 is removed by lightly immersing the device in a hydrofluoric acid solution thereby releasing the movable electrode 232 from the substrate. The etching solution such as EDP, etc. has a property of dissolving the silicon substrate except for only the layer in which boron is diffused in a high concentration. Further the glass substrate and metals such as gold are left not to be dissolved in the etching solution. It is possible to easily change the thickness of the electrodes and the movable electrode about 1 μm to several tens μm by changing the temperature and the time of diffusion with the production method as described above. Since the boron diffusion layer is made of single crystal silicon, it is the noticeable characteristics of the structure that the mechanical property thereof is uniform. Therefore, when thick fixed electrodes or movable electrodes are formed, these electrodes never warp differently from conventional polysilicon films. Further, in the prior art production process, at least three masking steps for a lead wire and contacts of two times are necessary in addition to the steps previously illustrated, that is, a total of six masking steps is necessary. On the other had, in the process of the present invention, only five masking steps are required and so production is easier.

Figure 13A:
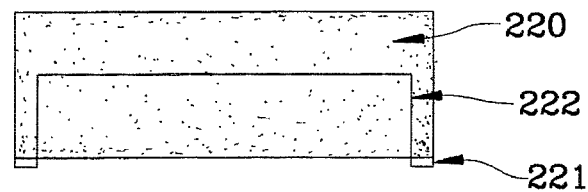
FIG. 13 shows process steps for producing a step motor as a seventh embodiment of the present invention.
Figure 13B:
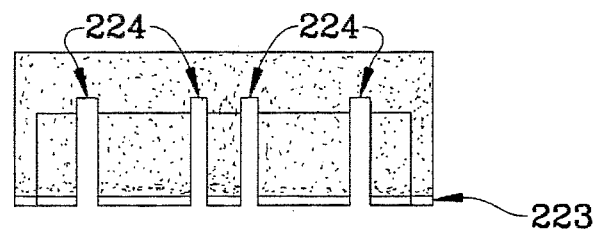
Figure 13C:
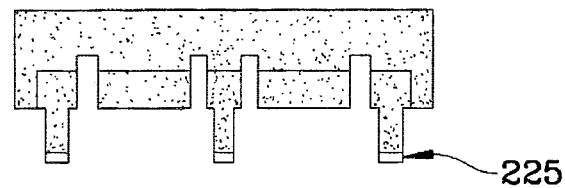
Figure 13D:
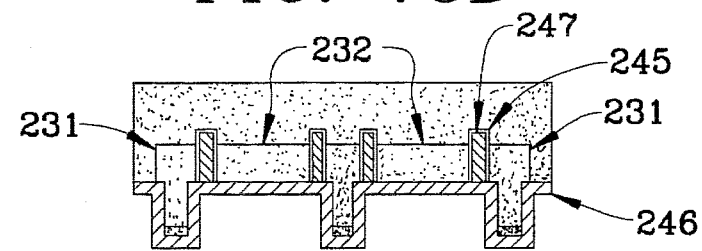
Figure 13E:
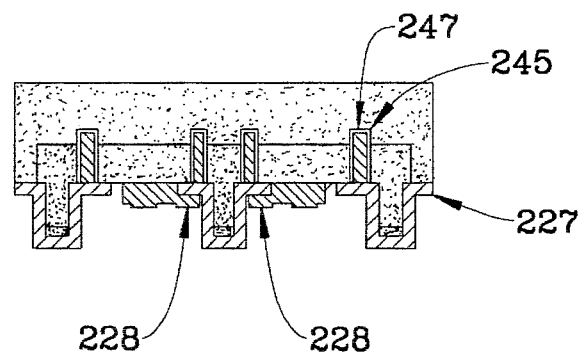

An example of another method for the production of the structure of the present invention will now be described with reference to FIG. 13. In FIG. 13, the components which are the same as those shown in FIG. 12 are given the same reference numerals. As the processes of FIG. 13(a) to FIG. 13(c) are the same as those of FIG. 12(a) to FIG. 12(c), their detailed descriptions are omitted. In FIG. 13, the oxide films 226 of FIG. 12 are patterned to form an oxide film 245 which covers only the trenches 224. After the trenches 224 are filled in with polysilicon, polysilicon films 247 are adopted to be left only in the trenches 224 by an etching-back processing. Then the total surface is masked with CVD oxide film 246 (FIG. 13(d). In the oxide film 246 there are formed windows for stopper means. Stopper means 248 made of polysilicon films are formed by depositing of polysilicon and patterning thereof. On the total surface of the device thus obtained, boron is diffused into polysilicon films 248 of stopper means (FIG. 13(c)). After the oxide film 246 is removed from the total surface by immersing the whole device in a hydrofluoric acid solution, the device is bonded to the glass substrate. The device is immersed in a silicon etching solution such as EDP, etc. to remove the silicon substrate 220 and the polysilicon 247. On the other hand, the polysilicon films 248 are left not to be etched because a high concentration of boron is diffused in the polysilicon. Finally the device is lightly immersed in a hydrofluoric acid solution to remove the oxide films 245, thereby releasing the movable electrode 232. In such a way, the stopper means 248 made of polysilicon can be formed. This structure is made of a single material, so that the strains within each stopper means which might cause problems can be made small. Each stopper means 248 may be made of non-doping type or n-type of polysilicon. Though boron was first diffused in this embodiment (FIG. 13(a)), boron may be diffused after the steps of FIG. 13(b) and FIG. 13(c). And the order of the steps of FIG. 13(b) and FIG. 13(c) may be reversed. In addition to stopping of etching of silicon by means of diffusion of a high concentration of boron, which was used in the production method of the embodiment, the electro-chemical method of stopping of etching is also effective, in which etching is stopped by applying an electrostatic voltage to a layer in which impurities different from the silicon substrate are diffused. When using this method, for example, in FIG. 12, the layer 22 may be made to be an n-type diffusion layer and the substrate may be made to be p-type. In order to make the whole impurity layer have the same potential upon etching step, it is recommended to short-circuit the metal wirings on the glass substrate outside the device, and to cut off the short-circuit for example at the time of cutting into chips after completion of etching of the silicon. In addition to the method for filling the trenches with polysilicon as described above in this embodiment, it falls also in the range of the present invention to fill the trenches with materials such as PSG, BPSG and the like by the use of methods such as HTO (High Temperature Oxidation) CVD, TEOS (Tetra Ethyl Ortho-Silicate) and so on.

Figure 14:
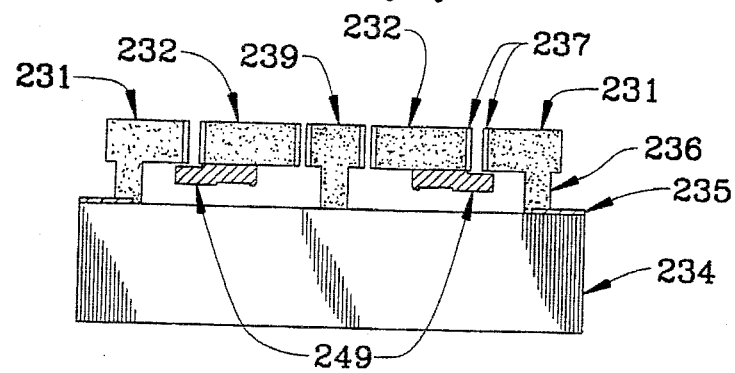
FIGS. 14, 15 and 16 respectively show cross sections of step motors as eighth to tenth embodiments of the present invention.

FIG. 14 shows another embodiment of the present invention. In FIG. 14, the components which are the same as those shown in FIG. 11 are given the same reference numerals. The constitution of FIG. 14 is the same as that of FIG. 14 except for the stopper means 249. In this embodiment the stopper means 249 are arranged around the movable electrode 232. The leading edge of each stopper means 249 is formed to cover a part of the fixed electrode 231. Since the movable electrode 232 contacts frequently with the central fixed electrode 239 during rotation of the movable electrode 232, the material inside the movable electrode 232 is apt to wear. The structure of this embodiment has the advantage that the device is difficult to be damaged compared to that of FIG. 11.

Figure 15:
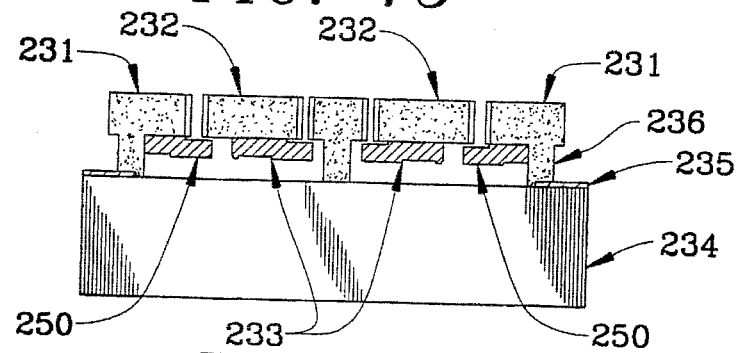

FIG. 15 shows still another embodiment of the present invention. In FIG. 15, the components which are the same as those shown in FIG. 11 are given the same reference numerals. The structure of FIG. 15 is the same as that of FIG. 11 except for stopper means 250. In this embodiment stopper means 250 are arranged adjacent to the fixed electrodes 231 in addition to the stopper means 233. Since the movable electrode 232 can be prevented from contacting with the glass substrate 234 and can limit the vertical movement of the movable electrode 232 in a small range, by means of the stopper means 50, it is always possible to set constant the relative position between the movable electrode 232 and the fixed electrode 231. Thus, it is possible to keep the electric static force acting on the movable electrode 232 constant despite the movement of the movable electrode.

Figure 16:
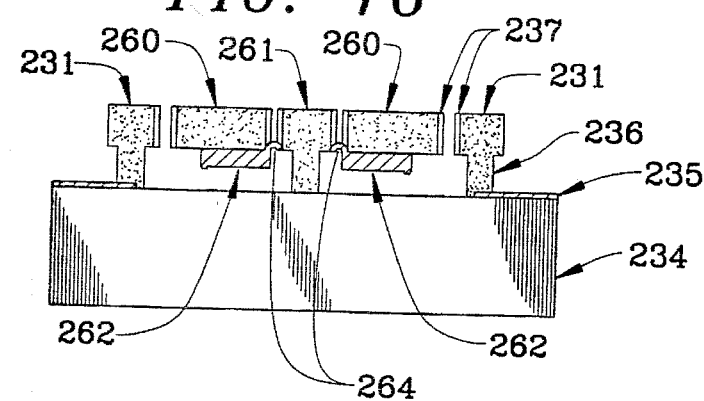

FIG. 16 shows still another embodiment of the present invention. In FIG. 16, the components which are the same as those shown in FIG. 11 are given the same reference numerals. The structure of FIG. 16 is the same as that of FIG. 11 except for the construction of the portion in which the stopper means 262 contacts the central fixed electrode 261 and the movable electrode 260. In this embodiment, each stopper means 262 is provided with a semispherical projection 264 on the side of the movable electrode 260. The stopper means 262 is made of contact with the central fixed electrode 261 having a semispherical recess through the projection 264. In the construction having the contact between spherical surfaces, the contact area between the stopper means and the fixed electrodes can be made smaller compared to the construction having the contact between flat surfaces. Thus the friction between the stopper means 262 and the fixed electrode 261 can be made smaller. This is useful for reduction of wear of the device and effective movement of the movable electrode 260. The shapes of the projection 264 and the recess are limited to semispherical ones. The shapes may be an arbitrary smooth shape which can make the contact area small, for example such a shape that an ellipsoid of revolution spheroid is divided into two halves.

Figure 17A:
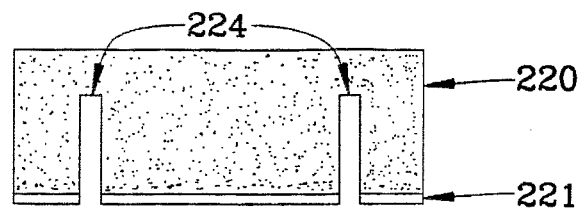
FIG. 17 shows process steps for producing the step motor shown in FIG. 16.
Figure 17B:
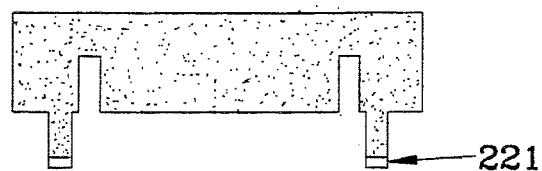
Figure 17C:
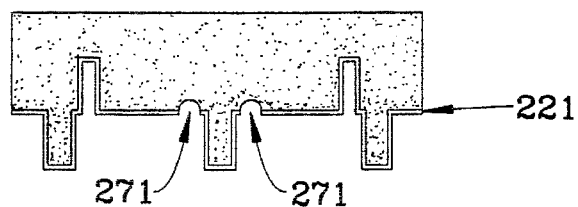
Figure 17D:
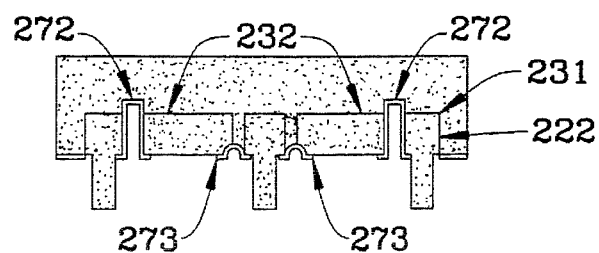
Figure 17E:
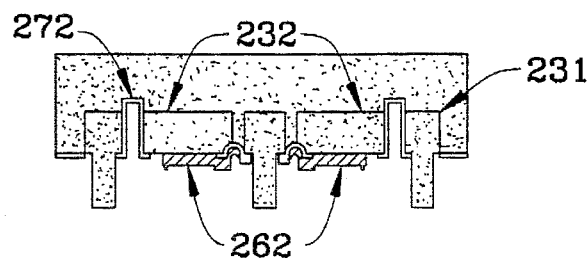

FIG. 17(a) to 17(c) show an embodiment of a method of production of the structure shown in FIG. 16. In FIG. 17 the components which are the same as shown in FIG. 12 are given the same reference numerals. An oxide film 221 is formed on the silicon single crystal substrate 220 so as to form the trenches 224 by removing silicon material from the area where the oxide film 221 is partly removed (FIG. 17(a)). The oxide film 221 is partly removed to form the oxide film 223. Then, by using the film 223 as a mask, the silicon substrate 220 is etch shallowly (FIG. 17(b)). After the oxide film 223 is removed, an oxide film 270 is formed. After windows are formed in parts of the oxide film 270, semispherical holes 271 are formed in the silicon substrate by the use of an isotropic etching solution such as a mixture solution of nitric acid and hydrofluoric acid (FIG. 17(c)). After the silicon substrate is oxidized again, boron is diffused except for the surfaces of the oxide films within the trenches 224 and the semispherical holes 73 (FIG. 17(d)). Next, stopper means 262 are formed by the method shown in FIG. 12 or FIG. 13 (FIG. 17(e)). The explanation of subsequent production processes are omitted because they are the same as those described in FIG. 12 or FIG. 13.

Figure 18:
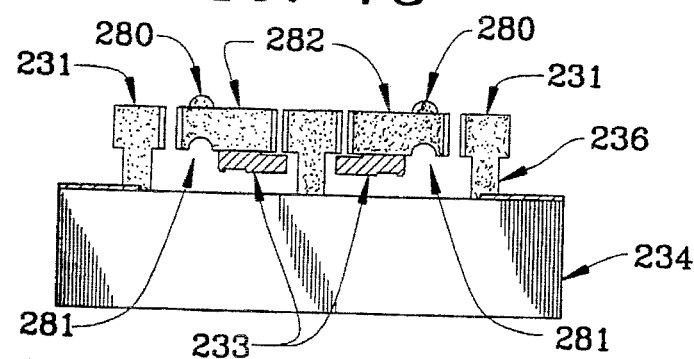

FIG. 18 shows another embodiment of the present invention. In FIG. 17 the components which are the same as those shown in FIG. 11 are given the same reference numerals. In the structure of FIG. 18, a part of a movable electrode 282 is provided with semispherical projections 280 and recesses 281. It is well-known in the field of hydrodynamics that when there exist projections at the portion which contacts fluid, the pressure of the fluid acting on the portion fluctuates. In the structure of FIG. 18, with the rotation of the movable electrode 282, upward lift acts on the movable electrode 282. Consequently, the friction between the stopper means 233 and the substrate 234 is reduced so that the efficiency of the movement of the movable electrode can be improved. Though both the projections and the recesses are formed in FIG. 18, only either the recesses or the projections may be formed. Though the recesses and the projection are formed in the movable electrode 282 in FIG. 18, they may be arranged in the stopper means 233 or in both electrode and the stopper means. The shape of the projection is not limited to the semispherical one, but the shape may be an arbitrary shape if it has such a shape that the lift acts thereon. The motor according to this embodiment may be provided with such projections and recesses as shown in FIG. 16.

Figure 19:
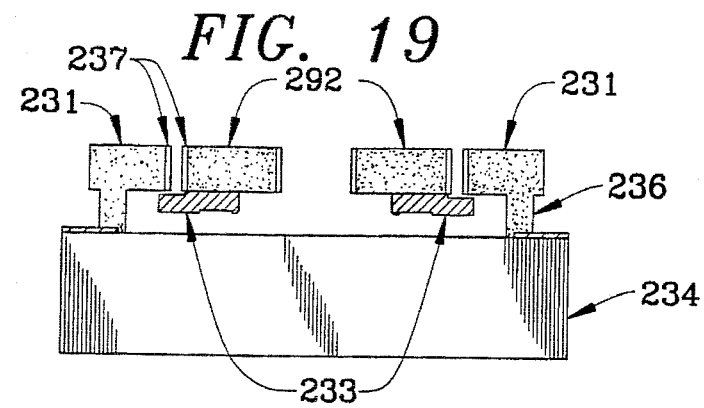
Figure 25A:
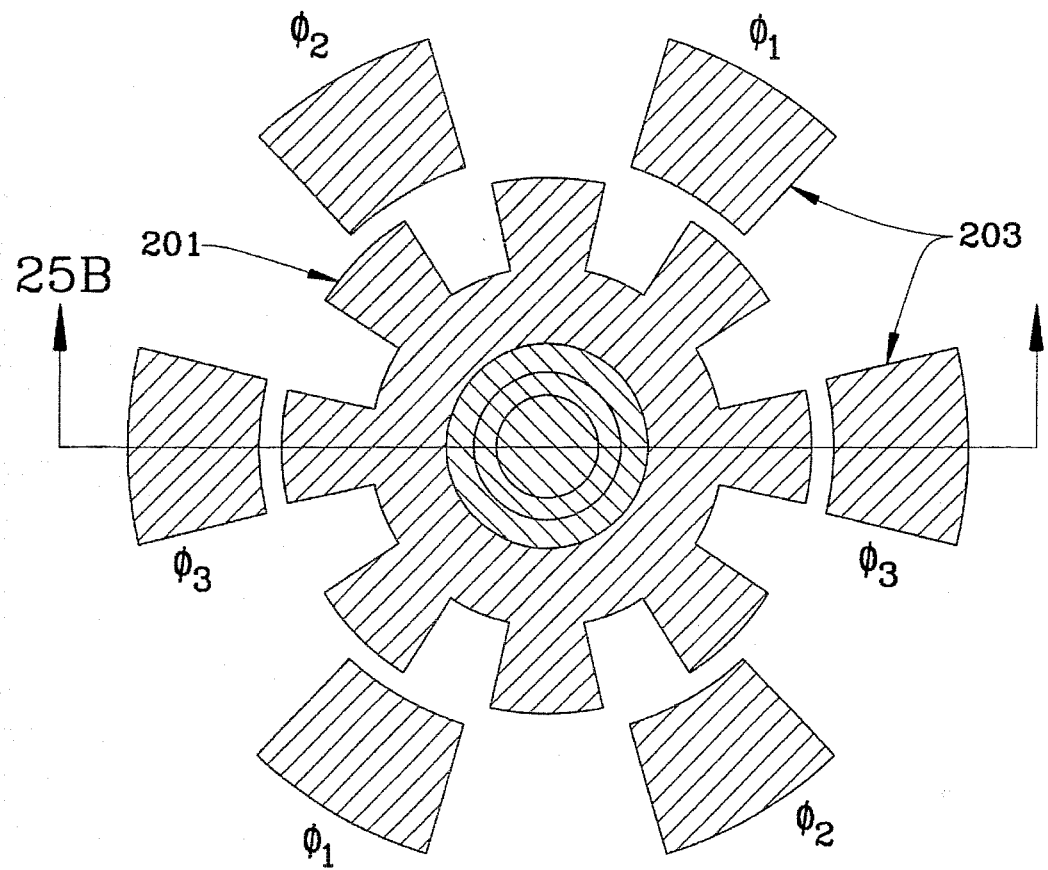
FIG. 25 shows a plan view (a) and a cross section (b) of a prior art step motor.
Figure 25B:
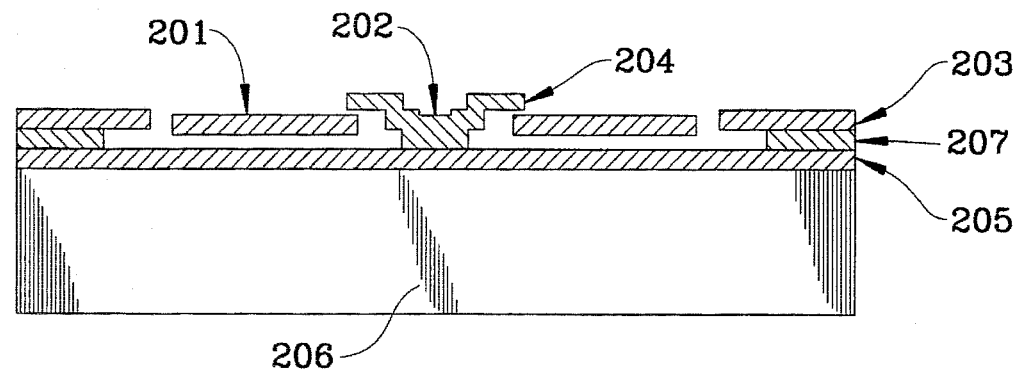
Figure 26A:
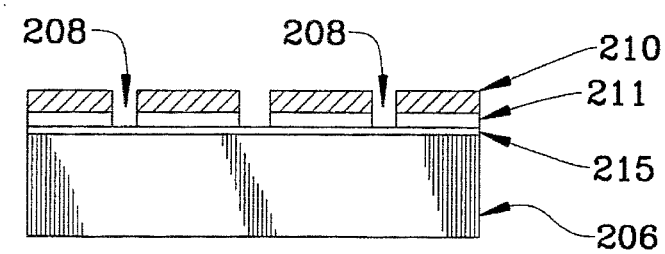
FIG. 26 shows process steps for producing the step of motor of FIG. 25 in accordance with prior art.
Figure 26B:
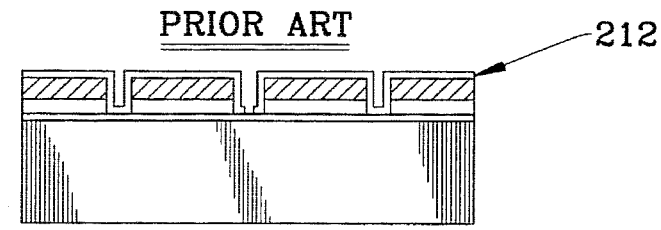
Figure 26C:
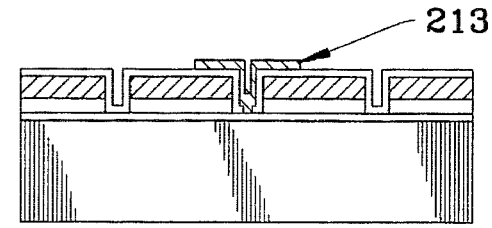
Figure 26D:
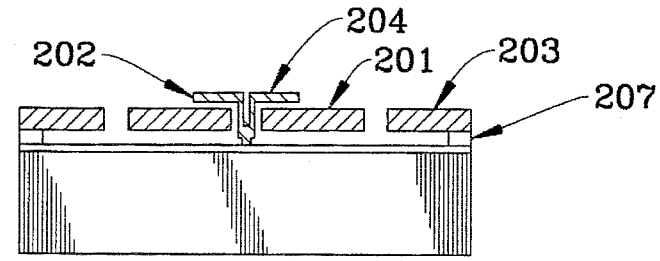

FIG. 19 shows still another embodiment of the present invention. In FIG. 19, the components which are the same as those shown in FIG. 14 are given the same reference numerals. The structure of FIG. 19 is the same as that of FIG. 14 except that the central fixed electrode 239 is removed and the movable electrode 292 consists of a circular body having no teeth. However, the structure of this embodiment differs remarkably from that of FIG. 14 in respect to the condition of motion and the performance. In the structure of FIG. 14, the movable electrode 232 having a shape of a gear shown in FIG. 25(a) which shows a conventional structure rotate in contact with the central fixed electrode 239. Since the electrostatic force for driving is supplied by the fixed electrode which is arranged around the periphery of the movable electrode, there has always produced a large friction force at the portion where the movable electrode is in contact with the central fixed electrode. Owing to this friction force, the inner periphery of the movable electrode wore away so as to shorten the service life of the device. On the other hand in this embodiment, the movable electrode 292 rotates while rolling in contact with the surrounding fixed electrode 231. Since the rolling friction is remarkably smaller than the usual friction, the movable electrode rotates smoothly. Therefore it is possible to remarkably reduce the damage due to wear of the movable electrode. In FIG. 19 as a material of each insulation wall 237, an oxide film, a nitride film or a compound film thereof can be used. The motor of this embodiment may be provided with such projection and recesses as shown in FIG. 16, or with such projections and recesses as shown in FIG. 18.

Figure 20:
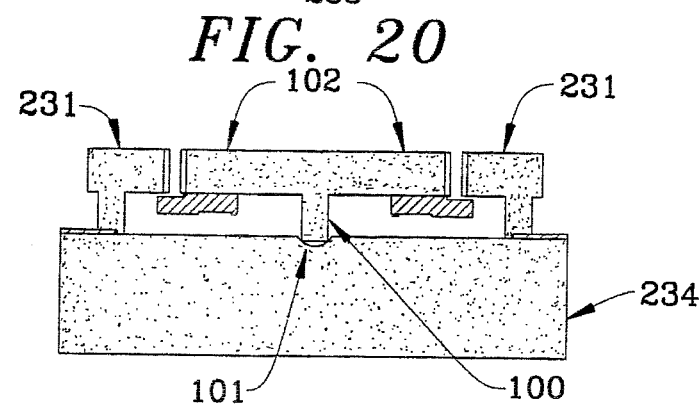

FIG. 20 shows another embodiment of the present invention. In FIG. 20, the components which are the same as those shown in FIG. 14 are given the same reference numerals. The structure of FIG. 20 is mainly characterized in that the central fixed electrode 239 of FIG. 14 is removed and a movable electrode 102 is provided with a central protruding portion 100. The movable electrode 102 can be rotated on the principle similar to that of rotation of a top by bringing the protruding portion into contact with the glass substrate 234. Upon rotation, the movable electrode 102 contacts with other material only through the central protruding portion. Then as the contact area is small, the friction acting on the movable electrode can be confined to a small value. And as shown in FIG. 20, there is opened a hole 101 for forming a gap by which the protruding portion 100 of the movable electrode can move. Besides this embodiment, it also fails in the range of the present invention to form a gap for movement of the movable electrode by shortening the protruding portion 100. This has an advantage that the hole 101 is not required to be formed on the glass substrate 234. This embodiment may be provided with such projections and recesses as shown in FIG. 16, or as shown in FIG. 18. The projections may be semispherical.

Figure 21:
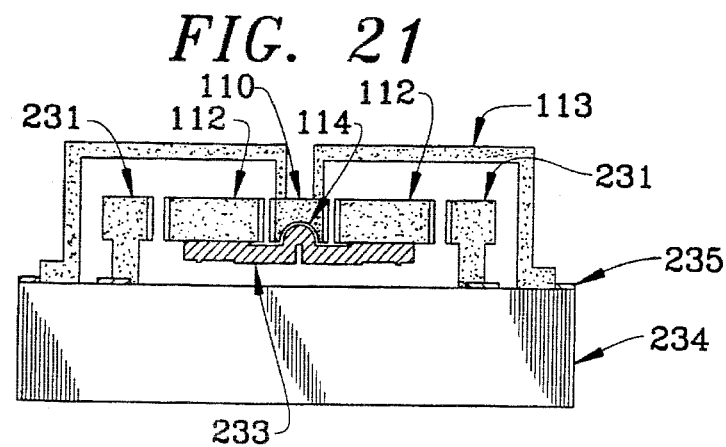

FIG. 21 shows still another embodiment. In FIG. 21, the components which are the same as those shown in FIG. 11 are given the same reference numerals. The structure of FIG. 21 differs remarkably from that of the embodiment in FIG. 11 in the constructions of a central fixed electrode and stopper means. In this embodiment, a central fixed electrode 110 is suspended by arms 113 over a movable electrode 112. Stopper means 111 connects the movable electrodes 112 with each other while being in contact with the fixed electrode 110 through a semispherical hole 114 which is formed at the central portion of the fixed electrode 110. This embodiment has an advantage that the friction between the fixed electrodes and the movable electrode can be decreased in the same manner as in the case of FIG. 16. The embodiment of FIG. 21 may be provided with such projections and recesses as shown in FIG. 18. Since there exists a space on the surface 234 under the movable electrode 112, it is possible to arrange an element having a new function in the space as described in the following embodiments.

Figure 22:
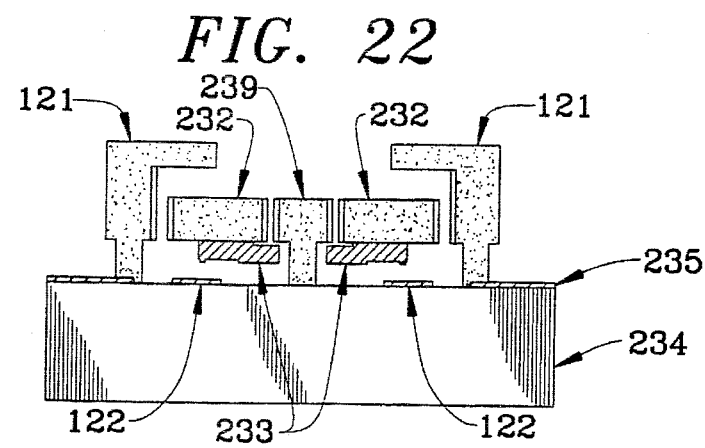

FIG. 22 shows a further embodiment. In FIG. 22, the components which are the same as those shown in FIG. 11 are given the same reference numerals. The structure of FIG. 22 differs from that of the embodiment shown in FIG. 11 in the constructions of a peripheral fixed electrode 121 and a fixed electrode 122 which is newly arranged on the glass substrate 234. In this embodiment, a movable electrode 232 is driven by the fixed electrodes 121 and 122 which are arranged over and below the movable electrode 232 respectively. When the electrodes 121 and 122 are arranged to have different projected positions, the movable electrode 232 can be rotated not to be in contact with the surfaces of a central fixed electrode 239 and the glass substrate 234 by controlling the voltage applied to the electrodes 121 and 122 are so arranged that the relative projected positions are different from each other and the driving voltage is successively supplied to the electrodes 121 and 122 in the order of the electrodes 121, 122 and 121, the movable electrode 232 can be rotated in a micromotion of a half of a pitch of the arrangement of the fixed electrodes shown in FIG. 11. Further the vertical position of the movable electrode can be controlled, by arranging the fixed electrode as shown in FIG. 22 in the region which is enlarged by suspending the central fixed electrode over the glass substrate as shown in the structure of FIG. 21. When a silicon substrate is used in place of the glass substrate, the fixed electrode can be arranged in such a region. The fixed electrode 122 on the glass substrate can be formed by a selection etching method of metals, or the use of silicon into which a high concentration of boron is diffused. This embodiment may be provided with projections and recesses as shown in FIG. 16 or FIG. 18. The central fixed electrode may be removed as shown in FIG. 19 and the central protruding portion may be provided as shown in FIG. 20.

Figure 23:
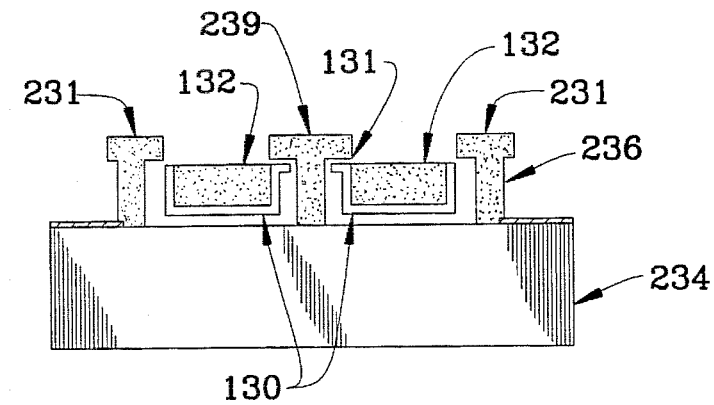
FIGS. 18 to 24 respectively show cross sections of step motors as eleventh to seventeenth embodiments of the present invention.

FIG. 23 shows still another embodiment of the present invention. In FIG. 23, the components which as the same as those shown in FIG. 11 are given the same reference numerals. The structure of FIG. 23 is different from that of the embodiment of FIG. 11 in the relative positions of a movable electrode 132 and peripheral fixed electrodes 231 and the construction of stopper means 130. In this embodiment, a knob 131 of the stopper means 130 is arranged at the level of the upper surface of the movable electrode 132. Thus, since the movable electrode 132 is positioned at the level lower than the upper surface of the fixed electrodes 231 and 239, the distribution of the electric lines of force between the peripheral fixed electrodes 231 and the central fixed electrode 239 becomes parallel to the surface of the glass substrate 234 over the whole movable electrode of the FIG. 23. Thus, the influence which is produced when the distribution of the electric lines of force is not parallel to the glass substrate 234 near the upper surface of the fixed electrodes 231 and 239, can be removed. Thus, the structure of the present invention has an advantage that rotation of the movable electrode 132 is made smoother because the more uniform force is acted on the electrode 132.

Figure 24:
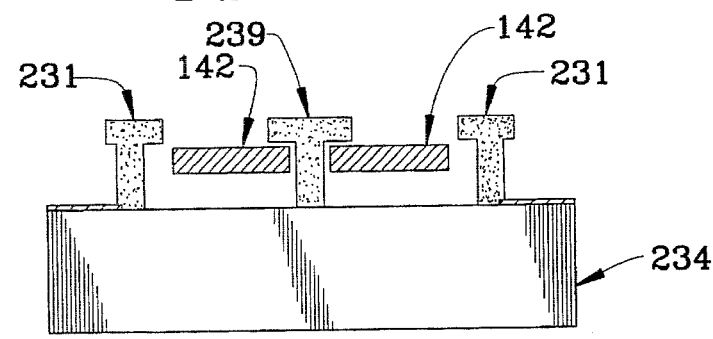

FIG. 24 shows still another embodiment of the present invention. In FIG. 24, the components which are the same as those shown in FIG. 11 are given the same reference numerals. In FIG. 24, a movable electrode 142 is made of polysilicon in the same manner as in the conventional example, while fixed electrodes 231 and 239 are made of single crystal silicon into which a high concentration of boron is diffused. By having such a construction, the freedom of design of the device become wide and the constructions and materials can be select in a wide range according to purposes.

Through single crystal Si of which the electrodes are made up are formed from the Si substrate in the embodiments described above, it is clear that there can be used single crystal Si which is formed on a glass substrate a sapphire substrate, a semiconductor substrate on the surface of which an insulation film is formed and the like by means of vapor phase epitaxy (containing selective epitaxy), laser annealing and so on.

Though in the embodiments of FIGS. 15 to 24 and variants thereof, at least one of electrodes is made of a single crystal semiconductor, one or all of the electrodes may be made of polysilicon.

In the above-mentioned devices, since the electrostatic force acts only between the teeth of the fixed electrode and the movable electrode to which different voltages are applied, the movable electrode can be moved so that the teeth of the movable electrode can conform to the position of the teeth of the fixed electrode to which the voltage is supplied, based on the condition of balancing of force. By causing the voltage to act on successively the succeeding teeth of the fixed electrodes, the movable electrode can be moved in the acting direction. And it is possible to detect the displacement of the movable electrode by detecting the position of a part of the movable electrode at a part of the fixed electrode side. For example, in this case, there may be arranged a detection circuit for detecting an electric capacity of the teeth of the fixed electrodes to which the driving voltage is not applied and the teeth of the movable electrode, or there may be arranged detection means on the side of the fixed electrodes for detecting the reflected beam produced by releasing a laser beam toward the movable electrode. The displacement controlling of the movable electrode can be more precisely performed by feeding back the signal which indicated the position of the movable electrode to the driving circuit on the fixed electrode side.

The construction, the production method and the driving method of the stepping motor which is rotatable in a plane have been described hereinbefore. Such an actuator can be used as a stepping motor described in the conventional example in that condition. Further a minute luminous reflection shutter can be produced by depositing and patterning metals, etc. on a flat surface at level of the teeth of the movable electrode by means of known methods. That is, the movable electrode can be used as a shutter according to the present invention, the optical shutter can be also produced by direct drawing through the use of the technique such as the optical CVD, etc. The present invention can be easily applied to an optical chopper in which the light beam entering through the glass substrate 234 from the back thereof is chopped by the teeth of the gear (the movable electrode). Further, a minute optical rotation head which can read and write for an optical disk can be produced by depositing optical fibers or light emitting devices and photo- detectors on the electrodes. Though in the above embodiments methods for driving by the electro-static force have been described, the fixed electrodes may be constituted by electric coils, etc. so as to drive the movable electrode with the electromagnetic force. The actuator according to the present invention is not limited to ones producing rotating motion, but the present invention can be easily applied to an actuator producing a linear motion. In this case the fixed electrode are linearly arranged around the movable electrode.

In the micromotion mechanical structure according to the present invention, the components thereof are made of single crystal semiconductors, so that the disadvantages of the structure constituted by this films of polysilicon in the conventional example have been remarkably improved. Since the thickness and the size of the components can be remarkably changed, the production and driving of the device have become easier. Since the internal stresses are not easy to produce when the components are made thicker, the deformation such as warping can be made small. When using the production method of the present invention, the structure can be produced in fewer masking steps than those of conventional examples so as to improve considerably the yield of the device. Since the structure according to the present invention is produced by laminating a single crystal semiconductor to another substrate, the analysis of the electric lines of force within the device can be made easier and the design of the device can be remarkably simplified when a glass substrate is selected for the other substrate. In particular, since the parasitic capacity of the substrate can be made very small, the structure has a remarkable advantage that the external applied voltage can be effectively utilized. Other than the above-described utilization, it is possible to realize a movable sensor machine which is very minute and can produce a high speed motion, when forming various sensors on an actuator made of a single crystal semiconductor. These effects are remarkable and the present invention is very useful.

I claim:

1. A process for the production of a micromotion mechanical structure comprising at least one fixed electrode and at least one movable electrode which is moved by electrostatic power applied to the fixed electrode; said process comprising the steps of:

(a) forming an electrode pattern of at least one of said fixed electrode and said movable electrode on a surface of a semiconductor substrate, (b) attaching the surface of the semiconductor substrate, on which said electrode pattern is formed, to a surface of a different substrate, and (c) separating said electrode pattern from the semiconductor substrate so that the electrode pattern remains on the surface of the different substrate.

2. The process according to claim 1, wherein said electrode pattern is formed in an area of said semiconductor substrate surface where a high concentration of boron is diffused in a silicon substrate.

3. The process according to claim 1, wherein said electrode pattern is formed in an area of said semiconductor substrate surface where an impurity of a type different from that of an impurity originally contained in the semiconductor substrate is diffused.

4. A process for the production of a micromotion mechanical structure comprising at least one fixed electrode and at least one movable electrode which is moved by electrostatic power applied to the fixed electrode said process comprising the steps of:

(a) forming on a surface of a semiconductor substrate an electrode pattern of at least one of said fixed electrode and said movable electrode and at least one stopper means for limiting the motion of the movable electrode, (b) attaching the surface of the semiconductor substrate, on which said electrode pattern and said stopper means are formed, to a surface of a different substrate, and (c) separating said electrode pattern and stopper means from the semiconductor substrate so that the electrode pattern and the stopper means remain on the surface of the different substrate.

5. The process according to claim 4, wherein said electrode pattern is formed in an area of said semiconductor substrate surface where a high concentration of boron is diffused in a silicon substrate.

6. The process according to claim 4, wherein said electrode pattern is formed in an area of said semiconductor substrate surface where an impurity of a type different from that of an impurity originally contained in the semiconductor substrate is diffused.

7. The process according to claim 4, wherein stopper means is formed after the electrode pattern is formed by providing trenches on the surface of the semiconductor substrate and the trenches are filled by a semiconductor material, and then, the semiconductor material filled in the trenches is removed.

* * * * *